(12) United States Patent
Wang

(10) Patent No.: US 12,334,904 B2
(45) Date of Patent: Jun. 17, 2025

(54) BULK ACOUSTIC WAVE FILTER HAVING RELEASE HOLE AND FABRICATING METHOD OF THE SAME

(71) Applicant: Shenzhen Newsonic Technologies Co., Ltd., Shenzhen (CN)

(72) Inventor: Jian Wang, Shenzhen (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 313 days.

(21) Appl. No.: 17/807,940

(22) Filed: Jun. 21, 2022

(65) Prior Publication Data

US 2022/0321094 A1   Oct. 6, 2022

(51) Int. Cl.
| | | |
|---|---|---|
| *H03H 9/17* | (2006.01) | |
| *H03H 3/02* | (2006.01) | |
| *H03H 9/13* | (2006.01) | |
| *H03H 9/54* | (2006.01) | |

(52) U.S. Cl.
CPC ............. *H03H 9/172* (2013.01); *H03H 3/02* (2013.01); *H03H 9/131* (2013.01); *H03H 9/54* (2013.01)

(58) Field of Classification Search
CPC ........... H03H 9/172; H03H 9/131; H03H 9/54
See application file for complete search history.

(56) References Cited

U.S. PATENT DOCUMENTS

| | | | | |
|---|---|---|---|---|
| 2006/0033595 | A1* | 2/2006 | Nagao | H03H 9/173 |
| | | | | 333/189 |
| 2007/0279153 | A1* | 12/2007 | Ruby | H03H 9/174 |
| | | | | 333/191 |
| 2020/0169246 | A1* | 5/2020 | Kim | H03H 9/02118 |
| 2020/0220520 | A1* | 7/2020 | Stokes | H03H 9/02118 |

* cited by examiner

*Primary Examiner* — Samuel S Outten
(74) *Attorney, Agent, or Firm* — Finnegan, Henderson, Farabow, Garrett & Dunner, LLP.

(57) ABSTRACT

A bulk acoustic wave resonator includes a substrate, a support layer disposed on the substrate, the support layer including a cavity having a polygon shape with more than three sides in a plane crossing a first direction from the substrate to the support layer, a piezoelectric layer disposed on the support layer, a bottom electrode disposed below the piezoelectric layer, partially overlapping the cavity, and extending across a first side of the cavity, and a top electrode disposed above the piezoelectric layer, partially overlapping the cavity, and extending across a second side of the cavity. The bulk acoustic wave resonator further includes at least one release hole formed in the piezoelectric layer and overlapping a portion of the cavity.

20 Claims, 29 Drawing Sheets

BULK ACOUSTIC WAVE FILTER HAVING RELEASE HOLE AND FABRICATING METHOD OF THE SAME

FIELD OF THE DISCLOSURE

The present disclosure relates to the field of semiconductor devices and, in particular, to a bulk acoustic wave filter having at least one release hole and a method of fabricating the filter.

BACKGROUND

A bulk acoustic resonator is a device including a thin film that is made of a piezoelectric material and disposed between two electrodes. The bulk acoustic resonator device is typically fabricated using semiconductor micro-processing technology.

Due to its small thickness, the bulk acoustic resonator device may be used in applications requiring high frequency, small size, and light weight. An exemplary application of the bulk acoustic resonator device is a bulk acoustic resonator filter used in mobile communication devices.

A bulk acoustic wave filter may include two or more bulk acoustic wave resonators. It is desirable to form a bulk acoustic wave filter having a smaller size.

SUMMARY

According to one aspect of the disclosure, a bulk acoustic wave resonator is provided. The bulk acoustic wave resonator includes a substrate, a support layer disposed on the substrate, the support layer including a cavity having a polygon shape with more than three sides in a plane crossing a first direction from the substrate to the support layer, a piezoelectric layer disposed on the support layer, a bottom electrode disposed below the piezoelectric layer, partially overlapping the cavity, and extending across a first side of the cavity, and a top electrode disposed above the piezoelectric layer, partially overlapping the cavity, and extending across a second side of the cavity. The bulk acoustic wave resonator further includes at least one release hole formed in the piezoelectric layer and overlapping a portion of the cavity. The at least one release hole includes at least one of: a first release hole located adjacent to a side of the cavity that is different from the first side and the second side; a second release hole located adjacent to a vertex of the cavity where two sides of the cavity meet, and not overlapping the bottom electrode or the top electrode; a third release hole located adjacent to the first side of the cavity, and overlapping the bottom electrode; and a fourth release hole located adjacent to the second side of the cavity, and overlapping the top electrode.

According to one aspect of the disclosure, a bulk acoustic wave filter is provided. The bulk acoustic wave filter includes a first bulk acoustic wave resonator and a second bulk acoustic wave resonator located next to each other. The first bulk acoustic wave resonator includes: a substrate; a support layer disposed on the substrate, the support layer including a cavity having a polygon shape with more than three sides, one side of the cavity being shared with a cavity of the second bulk acoustic wave resonator; a piezoelectric layer disposed on the support layer; a bottom electrode disposed below the piezoelectric layer, partially overlapping the cavity, and extending across a first side of the cavity; and a top electrode disposed above the piezoelectric layer, partially overlapping the cavity, and extending across a second side of the cavity. The first bulk acoustic wave resonator includes at least one release hole formed in the piezoelectric layer and overlapping a portion of the cavity. The at least one release hole includes at least one of: a first release hole located adjacent to a side of the cavity that is different from the first side and the second side; a second release hole located adjacent to a vertex of the cavity where two sides of the cavity meet, and not overlapping with the bottom electrode and the top electrode; a third release hole located adjacent to the first side of the cavity, and overlapping with the bottom electrode; a fourth release hole located adjacent to the second side of the cavity, and overlapping with the top electrode; and a fifth release hole located adjacent to an end of the side of the cavity that is shared with the cavity of the second bulk acoustic wave resonator.

BRIEF DESCRIPTION OF THE DRAWINGS

The accompanying drawings, which are incorporated in and constitute a part of this application, illustrate disclosed embodiments and, together with the description, serve to explain the disclosed embodiments.

DETAILED DESCRIPTION

Figure 1:
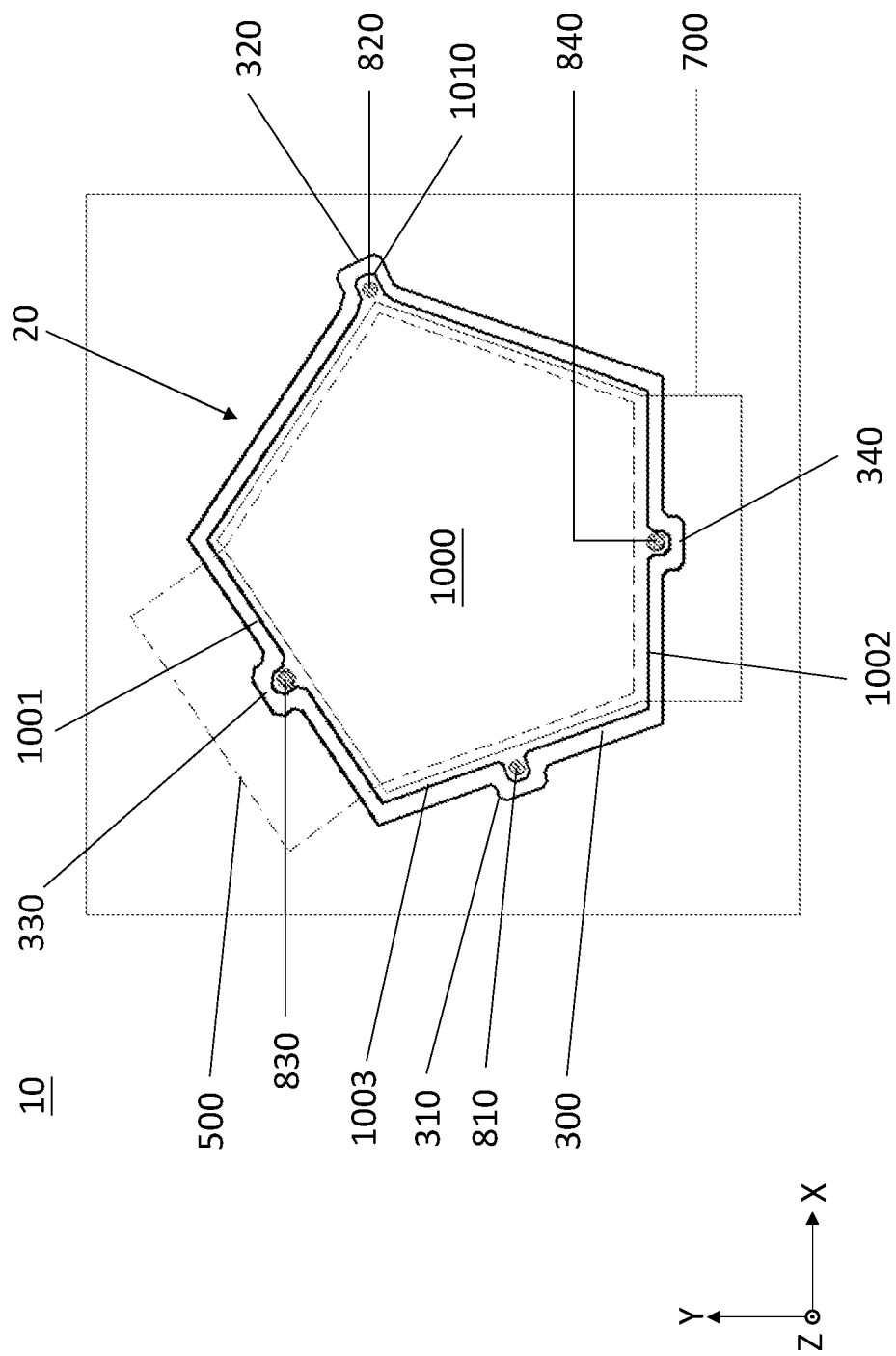
FIG. 1 is a top view of a bulk acoustic wave resonator for use in a bulk acoustic wave filter, according to an embodiment of the present disclosure.

The text below provides a detailed description of the present disclosure in conjunction with specific embodiments illustrated in the attached drawings. However, these embodiments do not limit the present disclosure. The scope of protection for the present disclosure covers changes made to the structure, method, or function by persons having ordinary skill in the art on the basis of these embodiments.

To facilitate the presentation of the drawings in the present disclosure, the sizes of certain structures or portions may be enlarged relative to other structures or portions. Therefore, the drawings in the present disclosure are only for the purpose of illustrating the basic structure of the subject matter of the present disclosure. The same numbers in different drawings represent the same or similar elements unless otherwise represented.

Additionally, terms in the text indicating relative spatial position, such as "top," "bottom," "upper," "lower," "above," "below," and so forth, are used for explanatory purposes in describing the relationship between a unit or feature depicted in a drawing and another unit or feature therein. Terms indicating relative spatial position may refer to positions other than those depicted in the drawings when a device is being used or operated. For example, if a device shown in a drawing is flipped over, a unit which is described as being positioned "below" or "under" another unit or feature will be located "above" the other unit or feature. Therefore, the illustrative term "below" may include positions both above and below. A device may be oriented in other ways (e.g., rotated 90 degrees or facing another direction), and descriptive terms that appear in the text and are related to space should be interpreted accordingly. When a component or layer is said to be "above" another member or layer or "connected to" another member or layer, it may be directly above the other member or layer or directly connected to the other member or layer, or there may be an intermediate component or layer.

FIG. 1 is a top view of a bulk acoustic wave resonator 20 for use in a bulk acoustic wave filter 10 according to an embodiment of the present disclosure. As illustrated in FIG. 1, bulk acoustic wave filter 10 includes bulk acoustic wave resonator 20 which includes a cavity 1000 surrounded by a boundary structure 300. Cavity 1000 has a polygon shape with more than three sides in a plane parallel to a major surface of bulk acoustic wave filter 10 (the X-Y plane in FIG. 1). For example, cavity 1000 may be a rectangle, a pentagon, a hexagon, etc. In the embodiment illustrated in FIG. 1, cavity 1000 is a pentagon. Bulk acoustic wave resonator 20 also includes a bottom electrode 500 partially overlapping cavity 1000 and extending across a first side 1001 of cavity 1000, and a top electrode 700 partially overlapping cavity 1000, and extending across a second side 1002 of cavity 1000. Portions of bottom electrode 500, top electrode 700, and a piezoelectric layer (not shown in FIG. 1) that overlap with each other form an active area.

Bulk acoustic wave resonator 20 further includes at least one of first through fourth release holes 810, 820, 830, and 840 overlapping a portion of cavity 1000. First release hole 810 is located adjacent to a side 1003 of cavity 1000 that is different from first side 1001 and second side 1002. Second release hole 820 is located adjacent to a vertex 1010 of cavity 1000 where two sides of cavity 1000 meet. Second release hole 820 does not overlap bottom electrode 500 or top electrode 700. Third release hole 830 is located adjacent to first side 1001 of cavity 1000, and overlaps bottom electrode 500. Fourth release hole 840 is located adjacent to second side 1002 of cavity 1000, and overlaps top electrode 700.

Cavity 1000 may be formed by an etching release process. Before the etching release process is performed, cavity 1000 is filled with materials such as $SiO_2$. During the etching release process, chemical etching solutions such as hydrofluoric acid etch the filled $SiO_2$ and etching product through the at least one of release holes 810, 820, 830, and 840.

Boundary structure 300 includes at least one protrusion 310, 320, 330, or 340 protruding away from the active area formed by portions of bottom electrode 500, the piezoelectric layer, and top electrode 700 that overlap with each other. The at least one release hole 810, 820, 830, or 840 is located next to the at least one protrusion 310, 320, 330, or 340. As illustrated in FIG. 1, first release hole 810 is located in an area partially surrounded by protrusion 310; second release hole 820 is located in an area partially surrounded by protrusion 320; third release hole 830 is located in an area partially surrounded by protrusion 330; and fourth release hole 840 is located in an area partially surrounded by protrusion 340.

Figure 2A:
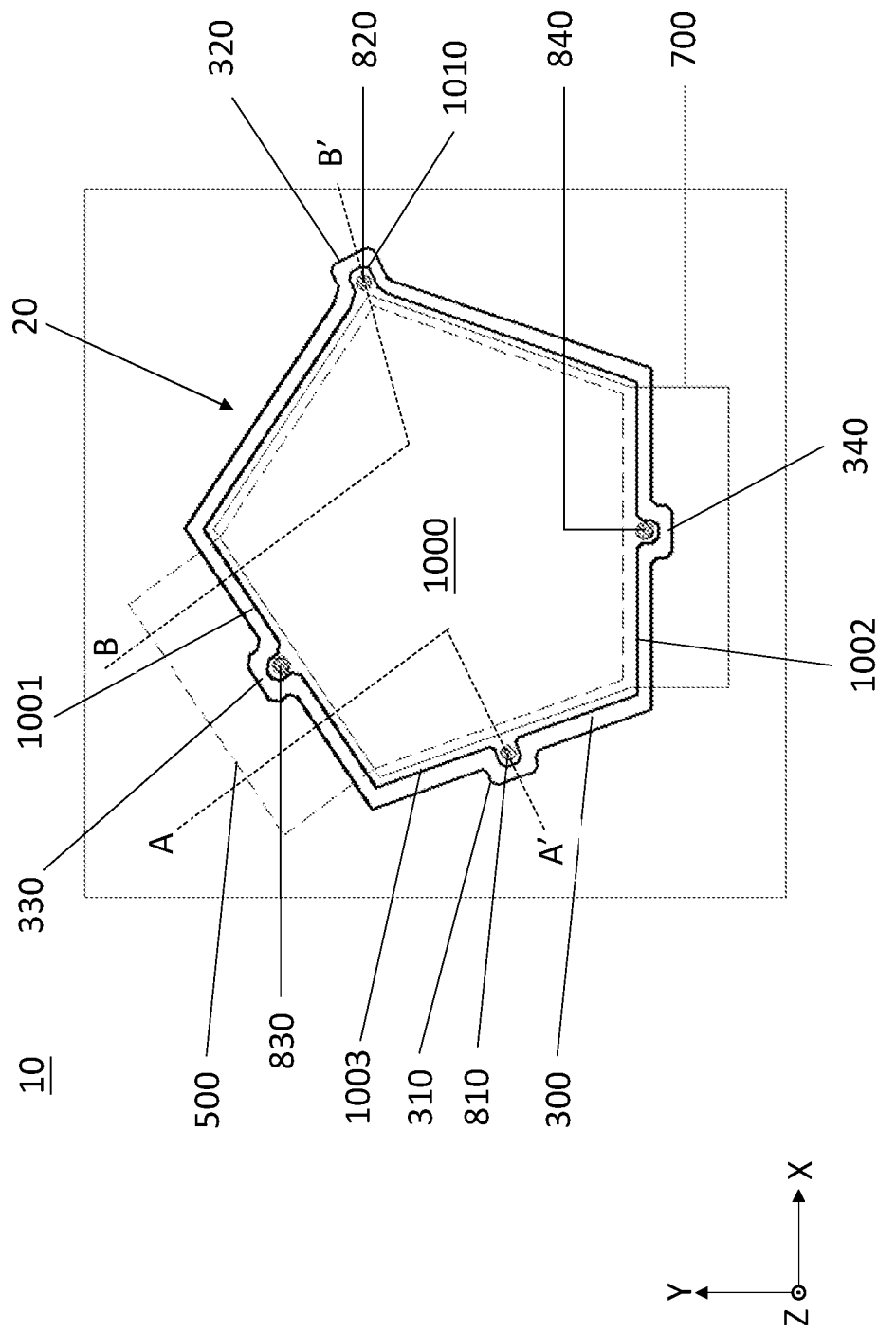
FIG. 2A is a top view of the bulk acoustic wave resonator for use in the bulk acoustic wave filter of FIG. 1, showing cross-sectional lines A-A' and B-B' on the bulk acoustic wave filter.
Figure 2B:
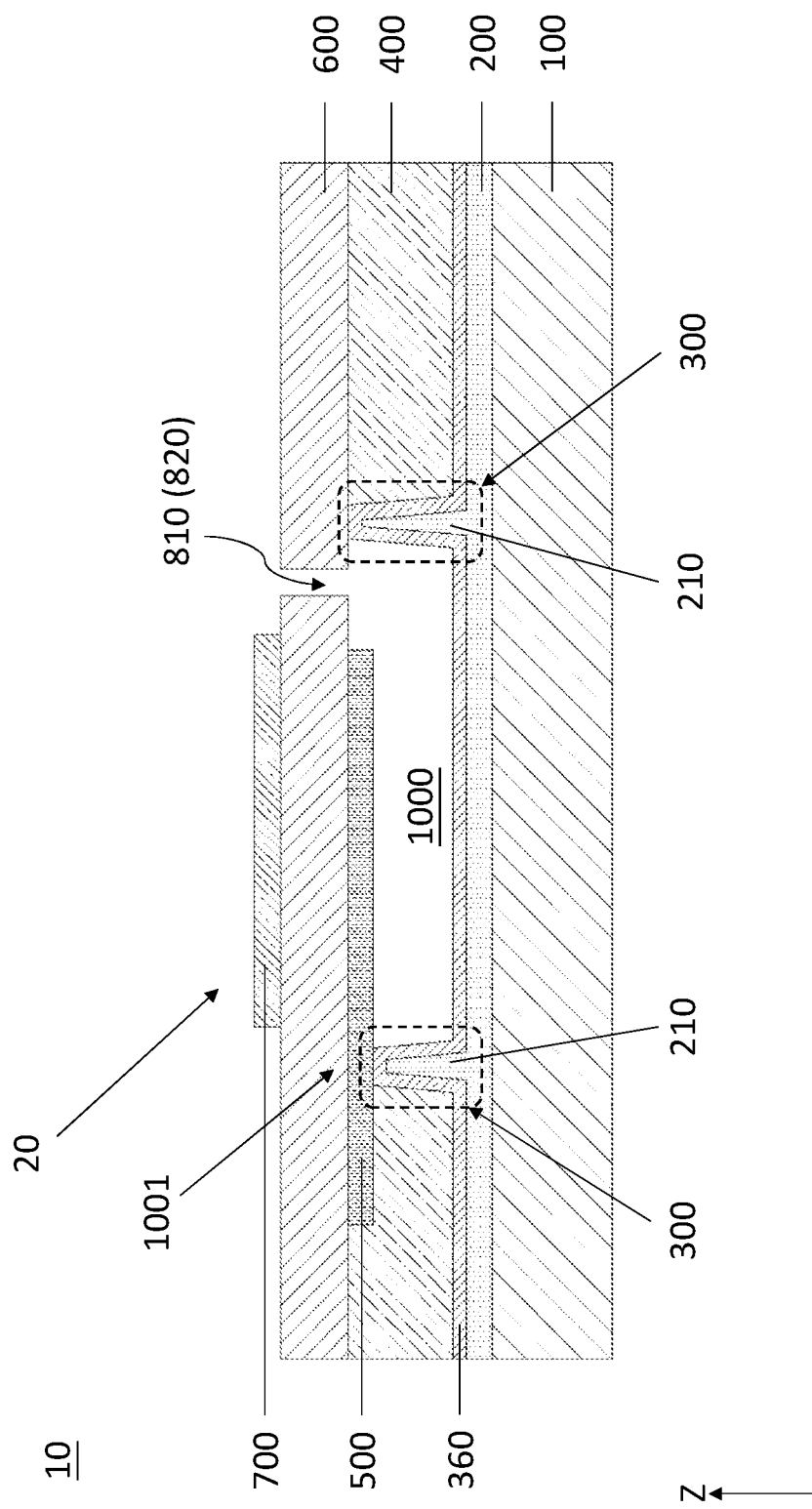
FIG. 2B is a cross-sectionally view of the bulk acoustic wave resonator for use in the bulk acoustic wave filter of FIG. 1, along cross-sectional line A-A' or B-B'.

FIG. 2A is a top view of bulk acoustic wave resonator 20 for use in bulk acoustic wave filter 10 of FIG. 1, showing cross-sectional lines A-A' and B-B' on bulk acoustic wave filter 10. FIG. 2B is a cross-sectionally view of bulk acoustic wave resonator 20 for use in bulk acoustic wave filter 10 of FIG. 1, along cross-sectional line A-A' or B-B'.

As illustrated in FIGS. 2A and 2B, bulk acoustic wave filter 10 includes bulk acoustic wave resonator 20 formed on a substrate 100. Substrate 100 may include a material such as, for example, Si, glass, SiC, sapphire ($Al_2O_3$), or GaN. A support layer 400 is disposed on substrate 100 and includes cavity 1000 having a polygon shape in a plane (the X-Y plane in FIG. 2A) crossing a direction from substrate 100 toward support layer 400 (the Z-axis direction in FIG. 2B). Support layer 400 may include a material such as $SiO_2$. A piezoelectric layer 600 is disposed on support layer 400, covering cavity 1000. Piezoelectric layer 600 may include a piezoelectric material such as, for example, AlN or scandium-doped AlN (ScAlN). Bottom electrode 500 is disposed below piezoelectric layer 600, partially overlapping cavity 1000, and extending across first side 1001 of cavity 1000. Top electrode 700 is disposed above piezoelectric layer 600, partially overlapping cavity 1000 and extending across second side 1002 of cavity 1000 (shown in FIG. 2A, but not shown in FIG. 2B). Bottom electrode 500 and top electrode 700 may include a metal material. First release hole 810 and second release hole 820 are formed in piezoelectric layer 600, overlapping portions of cavity 1000, and penetrating piezoelectric layer 600. First release hole 810 is located adjacent to a side of the cavity that is different from first side 1001 of cavity 1000 across which bottom electrode 500 extends. Second release hole 820 is located adjacent to a vertex of cavity 1000 where two sides of cavity 1000 meet. Neither one of first release hole 810 and second release hole 820 overlaps bottom electrode 500 or top electrode 700.

Bulk acoustic wave filter 10 further includes a bonding layer 200 disposed between substrate 100 and support layer 400. Bonding layer 200 includes a protruding structure 210 protruding towards piezoelectric layer 600 along direction Z. When viewing from a top of bulk acoustic wave filter 10, protruding structure 210 has a ring shape that surrounds cavity 1000. A boundary layer 360 overlies bonding layer 200, covering the upper surface of bonding layer 200 and side surfaces of protruding structure 210 that surrounds cavity 1000. Thus, boundary layer 360 defines the bottom and sidewalls of cavity 1000. Bonding layer 200 may include a bonding material such as $SiO_2$ for bonding substrate 100 and boundary layer 360.

Protruding structure 210 and the portions of boundary layer 360 formed on the side surfaces of protruding structure 210 constitute boundary structure 300 that surrounds cavity 1000. Boundary structure 300 has a double-wall structure with the bonding material formed between two sidewalls, which are provided by the portions of boundary layer 360 formed on the side surfaces of protruding structure 210. Boundary structure 300 having the double-wall structure is formed with a predetermined thickness. A top of boundary structure 300 is connected to either bottom electrode, or piezoelectric layer 600.

Figure 3A:
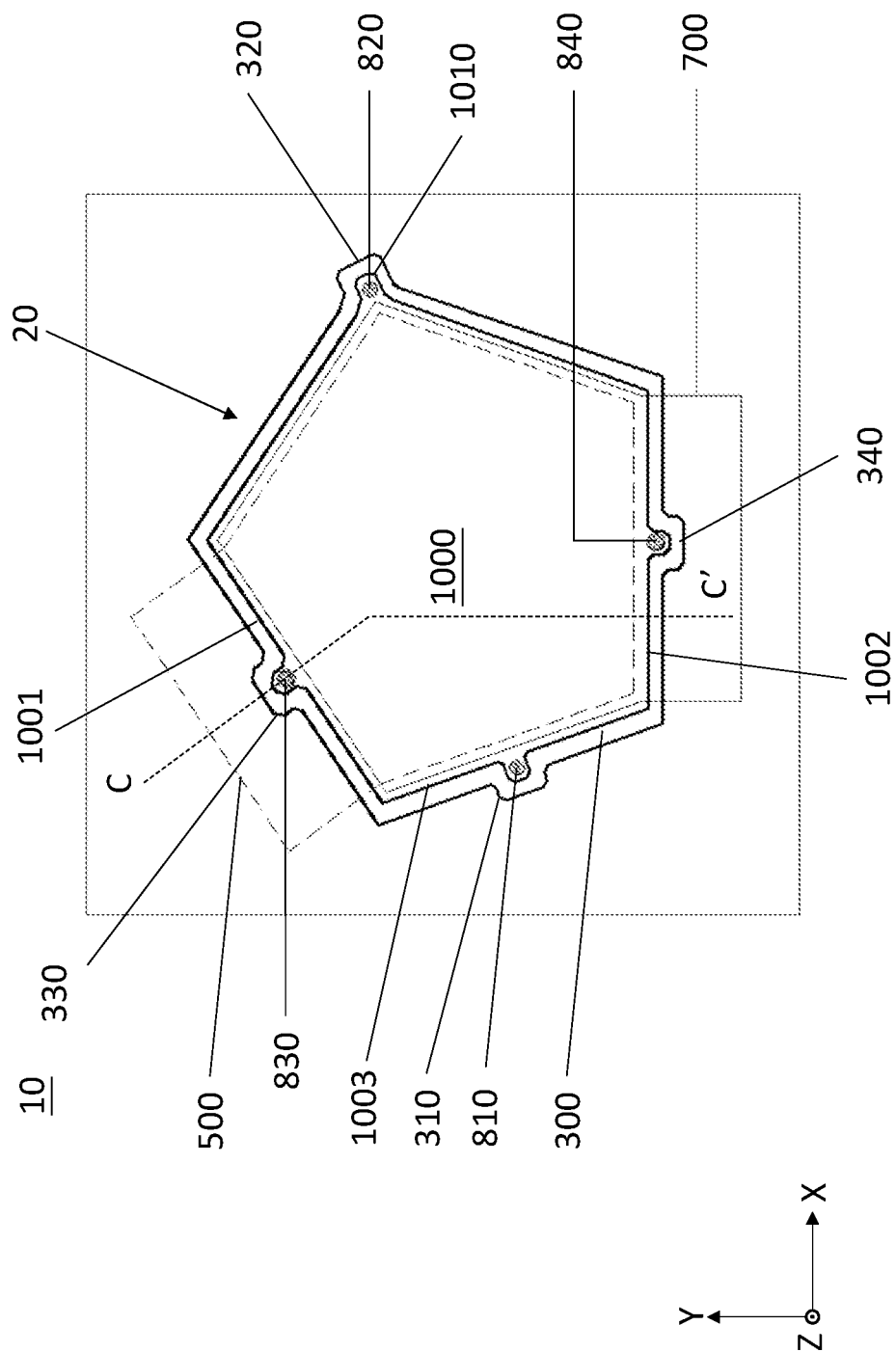
FIG. 3A is a top view of the bulk acoustic wave resonator for use in the bulk acoustic wave filter of FIG. 1, showing a cross-sectional line C-C' on the bulk acoustic wave filter.
Figure 3B:
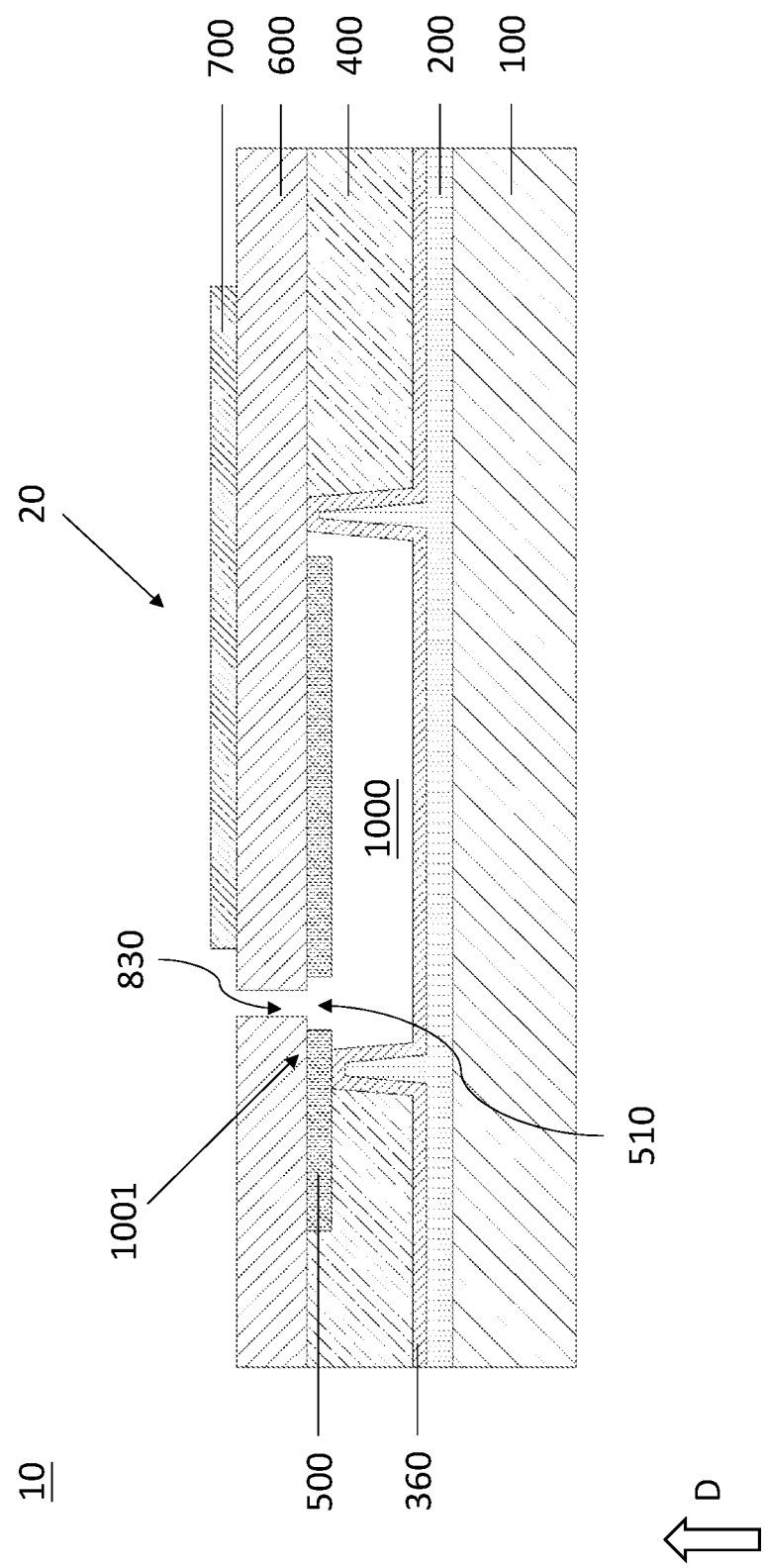
FIG. 3B is a cross-sectionally view of the bulk acoustic wave resonator for use in the bulk acoustic wave filter of FIG. 3A, along cross-sectional line C-C'.

FIG. 3A is a top view of bulk acoustic wave resonator 20 for use in bulk acoustic wave filter 10 of FIG. 1, showing a cross-sectional line C-C' on bulk acoustic wave filter 10. FIG. 3B is a cross-sectionally view of bulk acoustic wave resonator 20 for use in bulk acoustic wave filter 10 of FIG. 3A, along cross-sectional line C-C'.

As illustrated in FIGS. 3A and 3B, third release hole 830 is located adjacent to first side 1001 of cavity 1000 across which bottom electrode 500 extends. Third release hole 830 overlaps bottom electrode 500. Bottom electrode 500 includes an opening 510 penetrating bottom electrode 500. Opening 510 is connected with, and overlaps, third release hole 830. A diameter of opening 510 is greater than a diameter of third release hole 830.

Figure 4A:
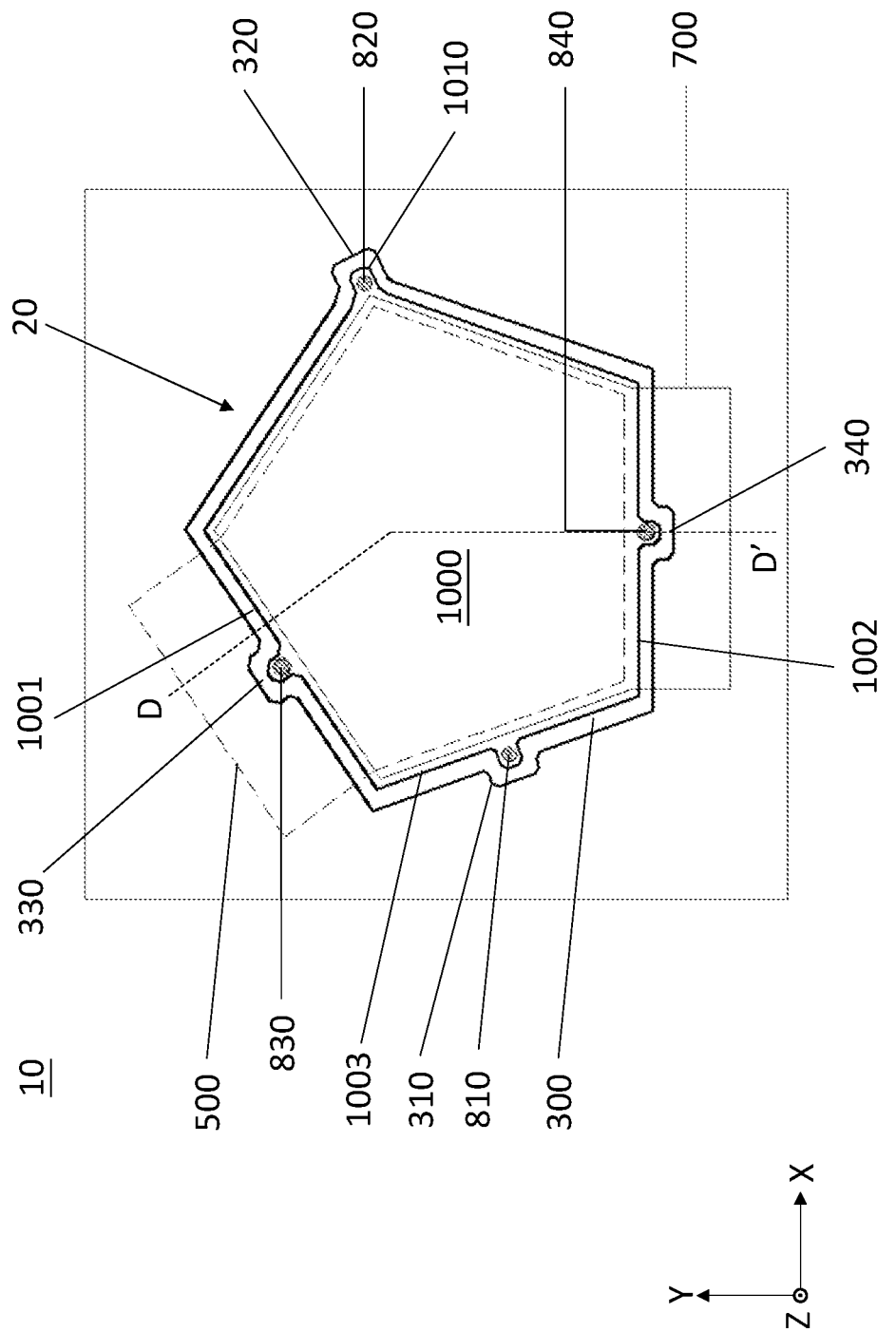
FIG. 4A is a top view of the bulk acoustic wave resonator for use in the bulk acoustic wave filter of FIG. 1, showing a cross-sectional line D-D' on the bulk acoustic wave filter.
Figure 4B:
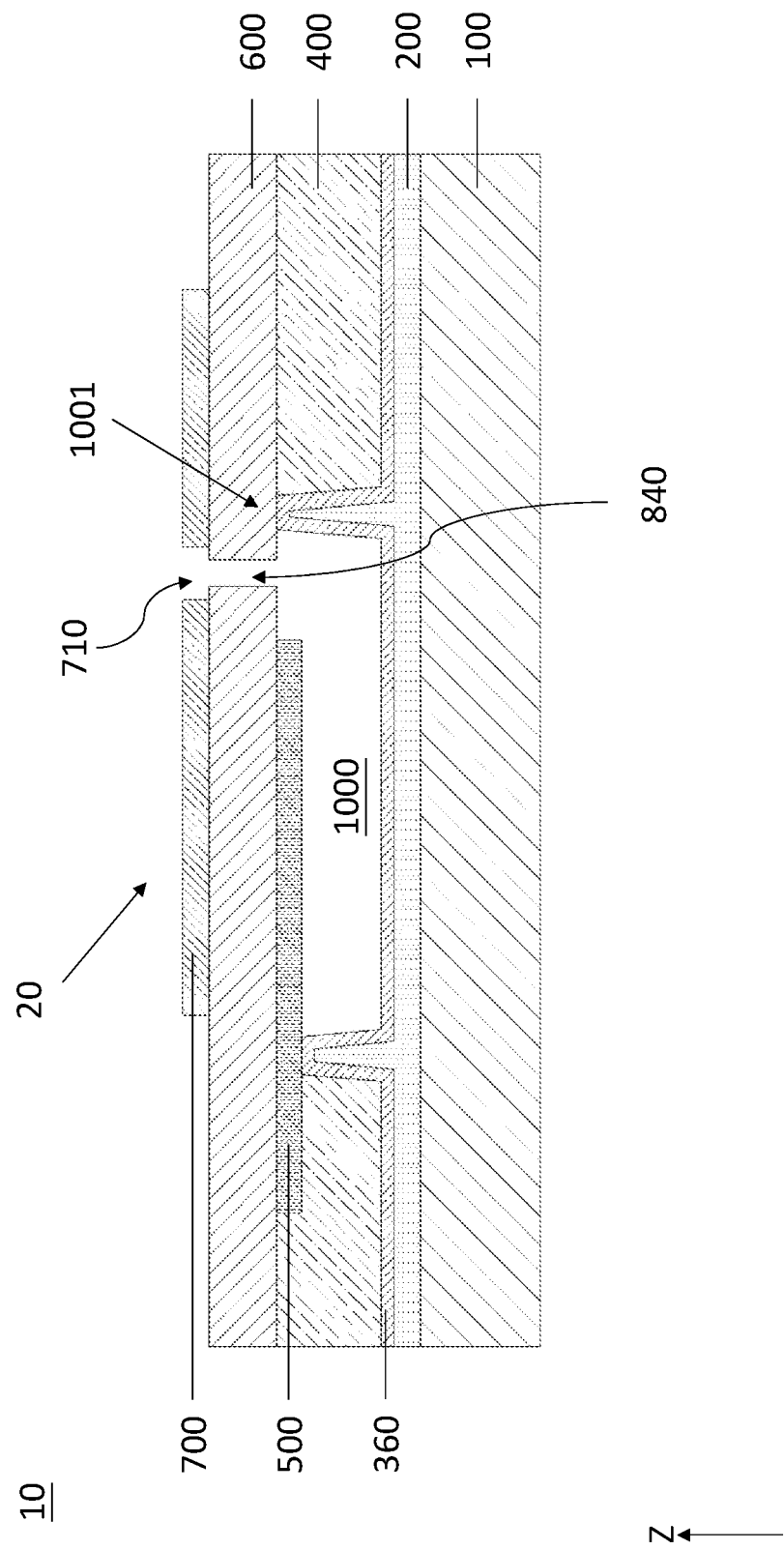
FIG. 4B is a cross-sectionally view of the bulk acoustic wave resonator for use in the bulk acoustic wave filter of FIG. 4A, along cross-sectional line D-D'.

FIG. 4A is a top view of bulk acoustic wave resonator 20 for use in bulk acoustic wave filter 10 of FIG. 1, showing a cross-sectional line D-D' on bulk acoustic wave filter 10. FIG. 4B is a cross-sectionally view of bulk acoustic wave resonator 20 for use in bulk acoustic wave filter 10 of FIG. 4A, along cross-sectional line D-D'.

As illustrated in FIGS. 4A and 4B, fourth release hole 840 is located adjacent to second side 1002 of cavity 1000 across which top electrode 700 extends. Fourth release hole 840 overlaps top electrode 700. Top electrode 700 includes an opening 710 penetrating top electrode 700. Opening 710 is connected with, and overlaps, fourth release hole 840. A diameter of opening 710 is greater than a diameter of fourth release hole 840.

Figure 5:
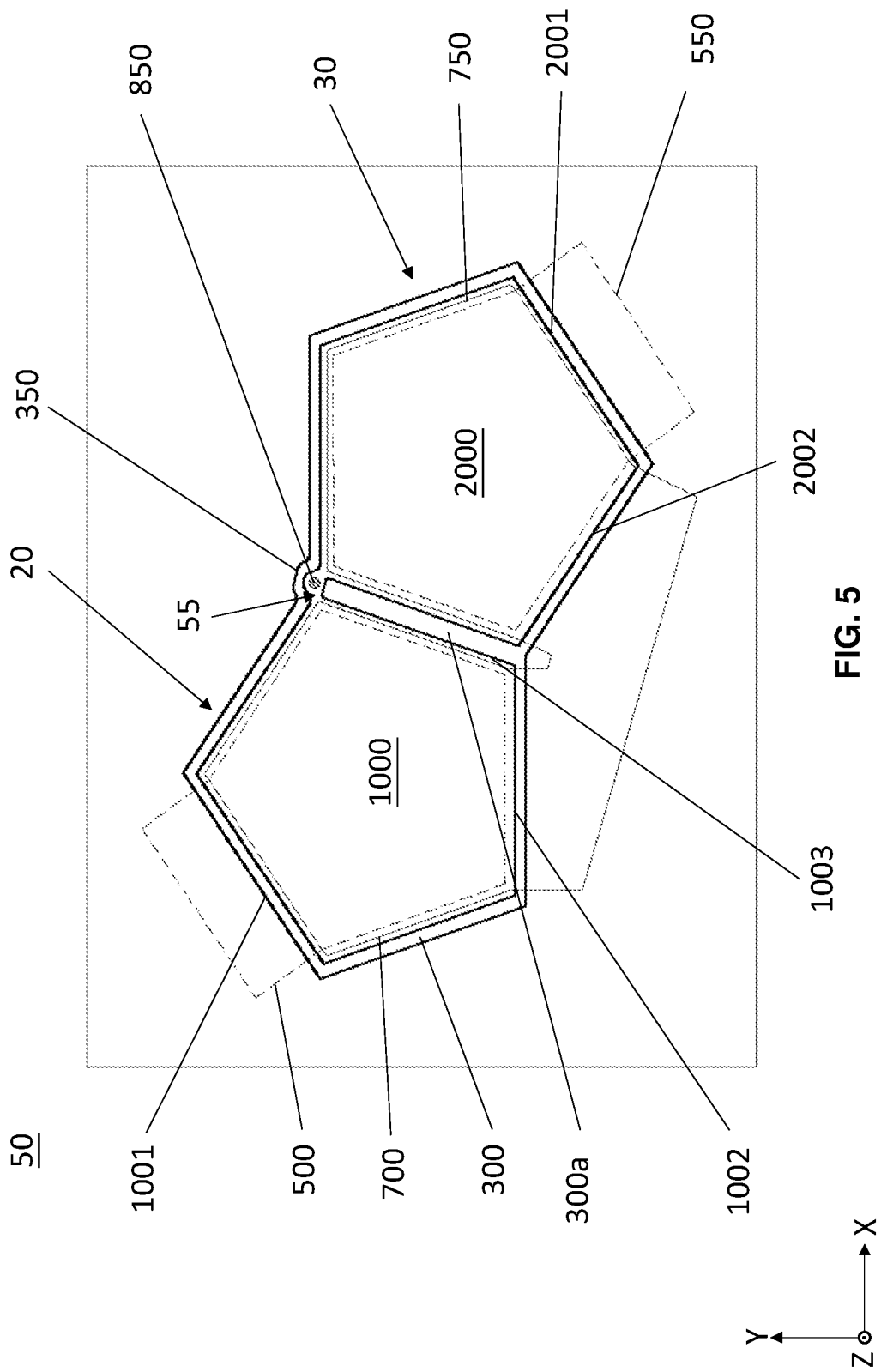
FIG. 5 is a top view of a bulk acoustic wave filter according to an embodiment of the present disclosure.

FIG. 5 is a top view of a bulk acoustic wave filter 50 according to an embodiment of the present disclosure. As illustrated in FIG. 5, bulk acoustic wave filter 50 includes a first bulk acoustic wave resonator 20 and a second bulk acoustic wave resonator 30 located next to each other. Each of first bulk acoustic wave resonator 20 and second bulk acoustic wave resonator 30 may have the same or similar structure to bulk acoustic wave resonator 20 illustrated in FIG. 1. For example, first bulk acoustic wave resonator 20 includes a first cavity 1000 surrounded by boundary structure 300, a first bottom electrode 500 partially overlapping first cavity 1000 and extending across a first side 1001 of first cavity 1000, and a first top electrode 700 partially overlapping first cavity 1000, and extending across a second side 1002 of first cavity 1000. Also for example, second bulk acoustic wave resonator 30 includes a second cavity 2000 surrounded by boundary structure 300 and located next to first cavity 1000, a second bottom electrode 550 partially overlapping second cavity 2000 and extending across a first side 2001 of second cavity 2000, and a second top electrode 750 partially overlapping second cavity 1000, and extending across a second side 2002 of second cavity 2000, which is adjacent to second side 1002 of first cavity 1000. In the embodiment illustrated in FIG. 5, first top electrode 700 and second top electrode 750 are connected in an area outside of first cavity 1000 and second cavity 2000.

Each one of first cavity 1000 and second cavity 2000 has a polygon shape with more than three sides in a plane parallel to a major surface of bulk acoustic wave filter 50 (the X-Y plane in FIG. 5). A side 1003 of first cavity 1000 is shared with second cavity 2000. Hereinafter, side 1003 is referred to as shared side 1003 between first cavity 1000 and second cavity 2000. First bulk acoustic wave resonator 20 includes a fifth release hole 850 located adjacent to an end of the shared side 1003 between first cavity 1000 and second cavity 2000. In other words, fifth release hole 850 is located adjacent to an included angle 55 between two neighboring sides of first cavity 1000 and second cavity 2000.

Boundary structure 300 includes a boundary portion 300a that extends between, and separates, first cavity 1000 and second cavity 2000. Boundary portion 300a is disposed along the shared side 1003 between first cavity 1000 and second cavity 2000. Boundary structure 300 includes a protrusion 350 protruding away from first and second bottom electrodes 500 and 550, and first and second top electrodes 700 and 750 in the X-Y plane. Release hole 850 is located next to, and partially surrounded by protrusion 350.

In the embodiment illustrated in FIG. 5, first bulk acoustic wave resonator 20 includes only one release hole 850. In alternative embodiments, first bulk acoustic wave resonator 20 may include at least one of release holes 810, 820, 830, 840, and 850. Likewise, second bulk acoustic wave resonator 30 may include at least one release hole at a location similar to those of release holes 810, 820, 830, 840, and 850.

Figure 6A:
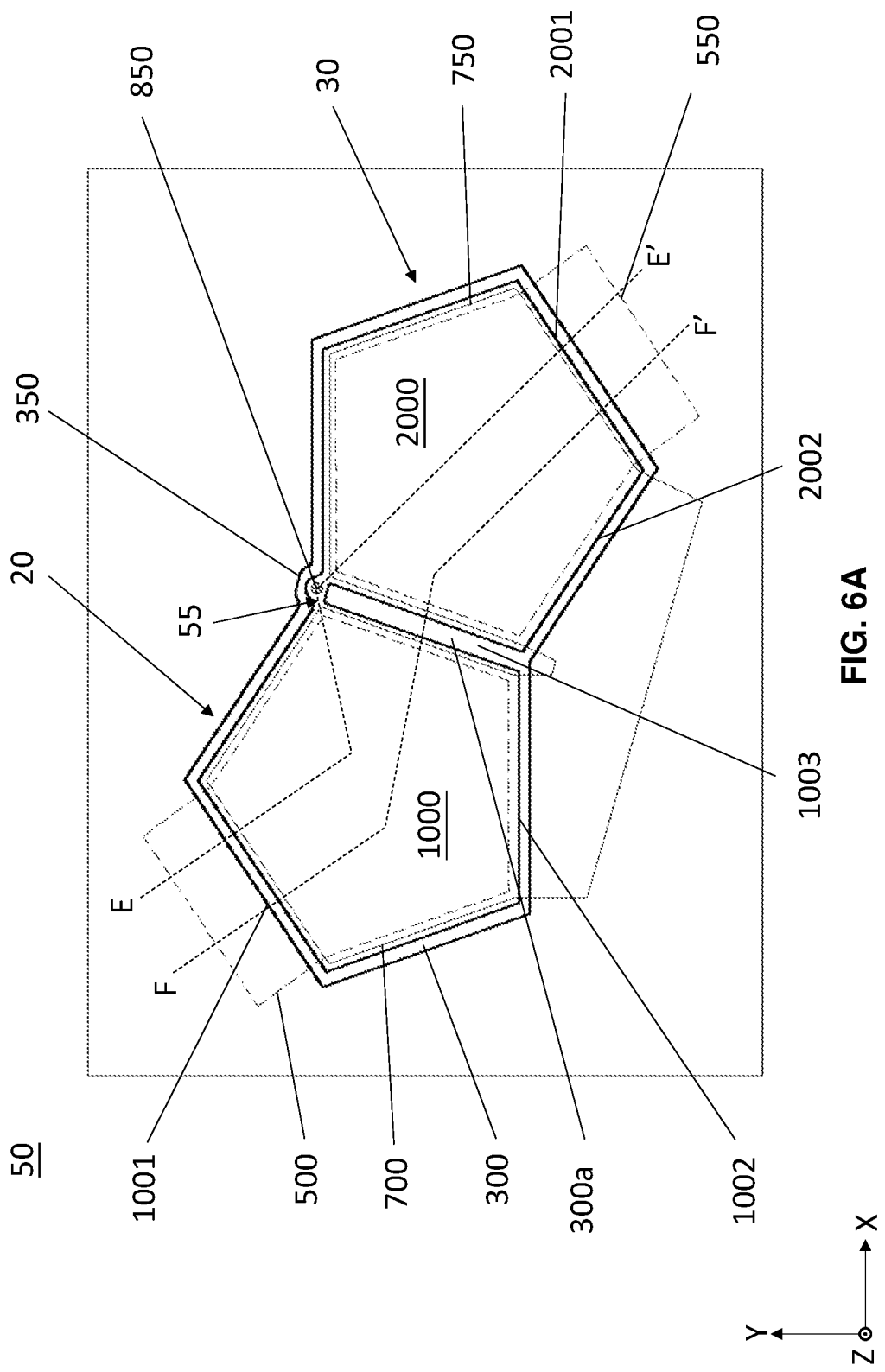
FIG. 6A is a top view of the bulk acoustic wave filter of FIG. 5, showing a cross-sectional lines E-E' and F-F' on the bulk acoustic wave filter.
Figure 6B:
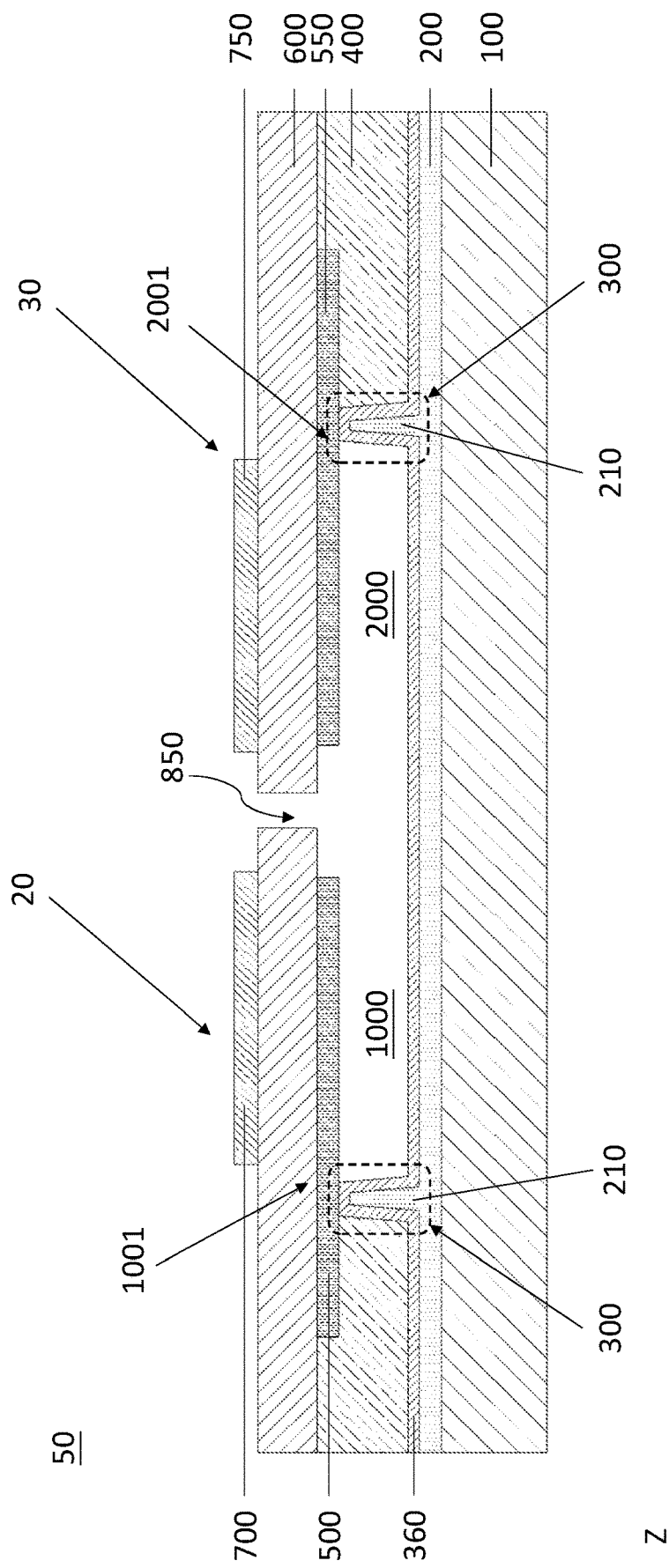
FIG. 6B is a cross-sectionally view of the bulk acoustic wave filter of FIG. 6A, along cross-sectional line E-E'.
Figure 6C:
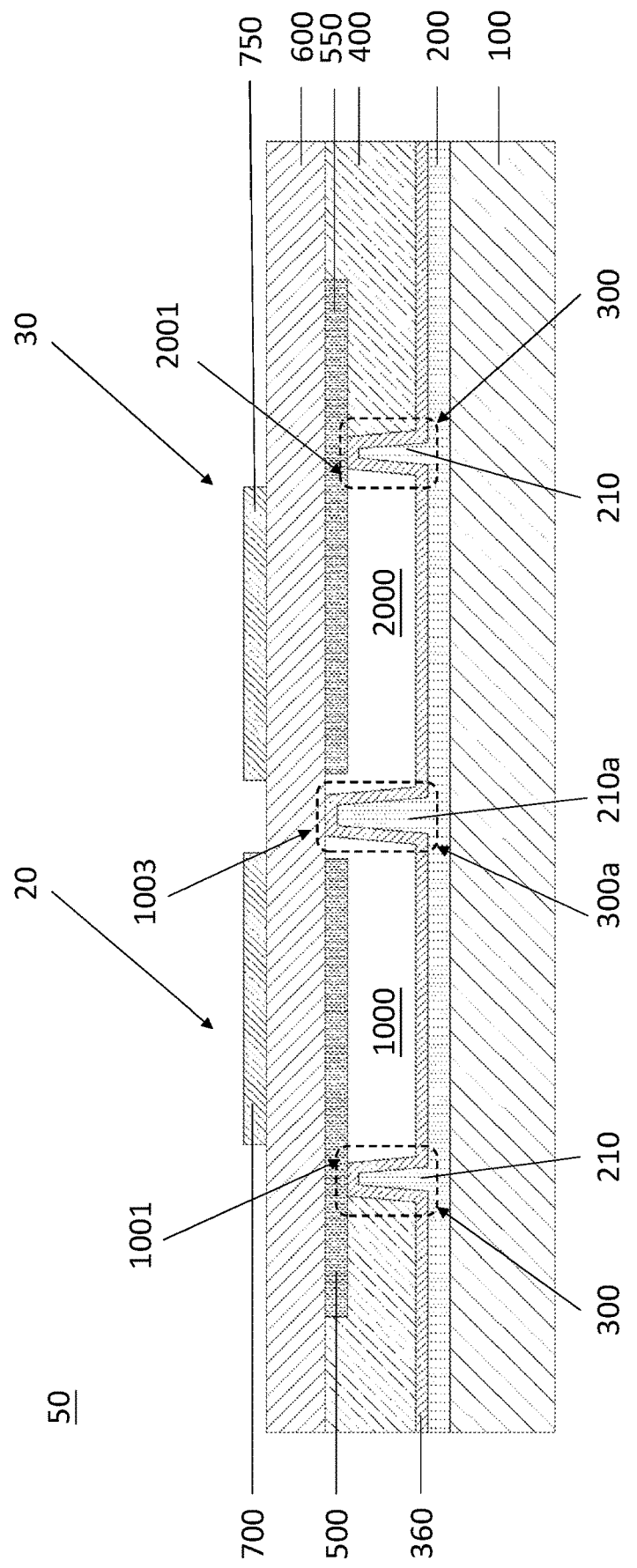
FIG. 6C is a cross-sectionally view of the bulk acoustic wave filter of FIG. 6A, along cross-sectional line F-F'.

FIG. 6A is a top view of bulk acoustic wave filter 50 of FIG. 5, showing a cross-sectional lines E-E' and F-F' on bulk acoustic wave filter 50. FIG. 6B is a cross-sectionally view of bulk acoustic wave filter 50 of FIG. 6A, along cross-sectional line E-E'. FIG. 6C is a cross-sectionally view of bulk acoustic wave filter 50 of FIG. 6A, along cross-sectional line F-F'.

As illustrated in FIGS. 6A-6C, bulk acoustic wave filter 50 includes first bulk acoustic wave resonator 20 and second bulk acoustic wave resonator 30 formed on substrate 100. A support layer 400 is disposed on substrate 100 and includes first cavity 1000 and second cavity 2000 each having a polygon shape in a plane (the X-Y plan) crossing a direction from substrate 100 toward support layer 400 (the Z-axis direction). Piezoelectric layer 600 is disposed on support layer 400, covering first cavity 1000 and second cavity 2000. First bottom electrode 500 and second bottom electrode 550 are disposed below piezoelectric layer 600. First bottom electrode 500 partially overlaps first cavity 1000, and extends across first side 1001 of cavity 1000. Second bottom electrode 550 partially overlaps second cavity 2000, and extends across first side 2001 of second cavity 2000. First top electrode 700 and second top electrode 750 are disposed above piezoelectric layer 600. First top electrode 700 partially overlaps first cavity 1000, and extends across second side 1002 of first cavity 1000 (shown in FIG. 6A, not shown in FIGS. 6B and 6C). Second top electrode 750 partially overlaps second cavity 1000, and extends across second side 2002 of second cavity 2000 (shown in FIG. 6A, not shown in FIGS. 6B and 6C). Fifth release hole 850 is formed in and penetrating piezoelectric layer 600.

Bulk acoustic wave filter 50 further includes bonding layer 200 disposed between substrate 100 and support layer 400. Bonding layer 200 includes protruding structure 210 protruding towards piezoelectric layer 600 along direction Z. When viewing from a top of bulk acoustic wave filter 50, protruding structure 210 is formed as two rings that surround first cavity 1000 and second cavity 2000. As illustrated in FIG. 6C, which is the cross-sectionally view of bulk acoustic wave filter 50 of FIG. 6A, along cross-sectional line F-F', protruding structure 210 includes a portion 210a disposed between first cavity 1000 and second cavity 2000.

Boundary layer 360 overlies bonding layer 200, covering the upper surface of bonding layer 200 and side surfaces of protruding structure 210 that surrounds cavity 1000. Thus, boundary layer 360 defines the bottom and sidewalls of first cavity 1000 and second cavity 2000.

Protruding structure 210 and the portions of boundary layer 360 formed on the side surfaces of protruding structure 210 constitute boundary structure 300 that surrounds cavity 1000. Boundary structure 300 has a double-wall structure with the bonding material formed between two sidewalls, which are provided by the portions of boundary layer 360 formed on the side surfaces of protruding structure 210. Boundary structure 300 having the double-wall structure is formed with a predetermined thickness. A top of boundary structure 300 is connected to either bottom electrode, or piezoelectric layer 600.

Boundary structure 300 includes a boundary portion 300a that extends between, and separates, first cavity 1000 and second cavity 2000. Boundary portion 300a is disposed along the shared side 1003 between first cavity 1000 and second cavity 2000.

FIGS. 7-10, 11A, 11B, 12A, 12B, 13A, 13B, 14A, 14B, 15A, 15B, 16A, 16B, 17A, and 17B show cross-sectional views of structures formed in a process of fabricating bulk acoustic wave filter 50, according to embodiments of the present disclosure. Of these figures, FIGS. 11A-17A are cross-sectional views of the structures along cross-sectional line E-E' on bulk acoustic wave filter 50 illustrated in FIG. 6A, and FIGS. 11B-17B are cross-sectional views of the structures along cross-sectional line F-F' on bulk acoustic wave filter 50 illustrated in FIG. 6A.

Figure 7:
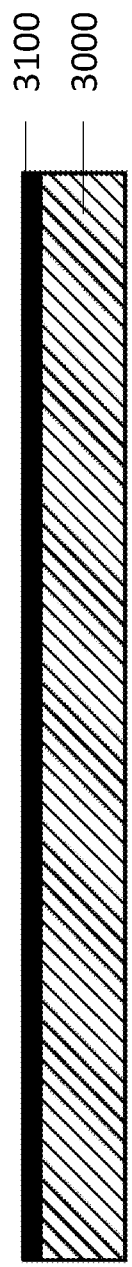
FIGS. 7-10, 11A, 11B, 12A, 12B, 13A, 13B, 14A, 14B, 15A, 15B, 16A, 16B, 17A, and 17B show cross-sectional views of structures formed in a process of fabricating the bulk acoustic wave filter of FIG. 5, according to embodiments of the present disclosure.

As illustrated in FIG. 7, a temporary substrate 3000 is obtained, and a silicon oxide layer 3100 is formed on temporary substrate 3000. Temporary substrate 3000 may include silicon (Si), silicon carbide (SiC), aluminum oxide, quartz, or glass, etc. Silicon oxide layer 3100 may be obtained by oxidizing a silicon substrate, or may be deposited on substrate 100 through a chemical vapor deposition (CVD) process. In the present embodiment, substrate 3100 includes silicon (Si).

Figure 8:
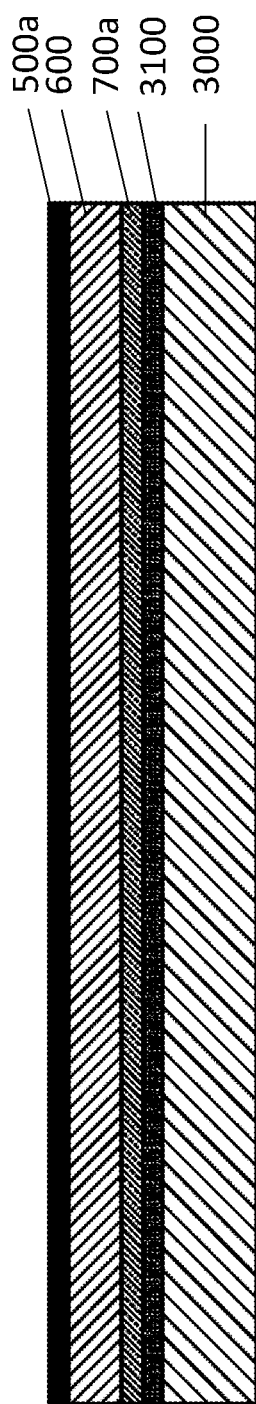

As illustrated in FIG. 8, a top electrode layer 700a, a piezoelectric layer 600, and a bottom electrode layer 500a are sequentially deposited on silicon oxide layer 3100. Top and bottom electrode layers 700a and 500a may include any suitable conductive material, such as various metal materials with conductive properties or a stack of several conductive metal materials, such as molybdenum (Mo), aluminum (Al), copper (Cu), platinum (Pt), tantalum (Ta), tungsten (W), palladium (Pd), ruthenium (Ru), etc. In the present embodiment, top and bottom electrode layers 700a and 500a include molybdenum (Mo). Piezoelectric layer 600 may include materials with piezoelectric properties or their stacked combination, such as aluminum nitride (AlN), zinc oxide (ZnO), lithium niobate (LiNbO$_3$), lithium tantalate (LiTaO$_3$), lead zirconate titanate (PZT), barium strontium titanate (BST), etc. When the material of piezoelectric layer 600 is aluminum nitride (AlN), the aluminum nitride itself may also be doped with a certain proportion of rare earth elements, such as scandium, erbium, lanthanum, etc. In the present embodiment, the material of the piezoelectric layer 600 includes aluminum nitride (AlN) or scandium doped aluminum nitride (ScAlN).

Figure 9:
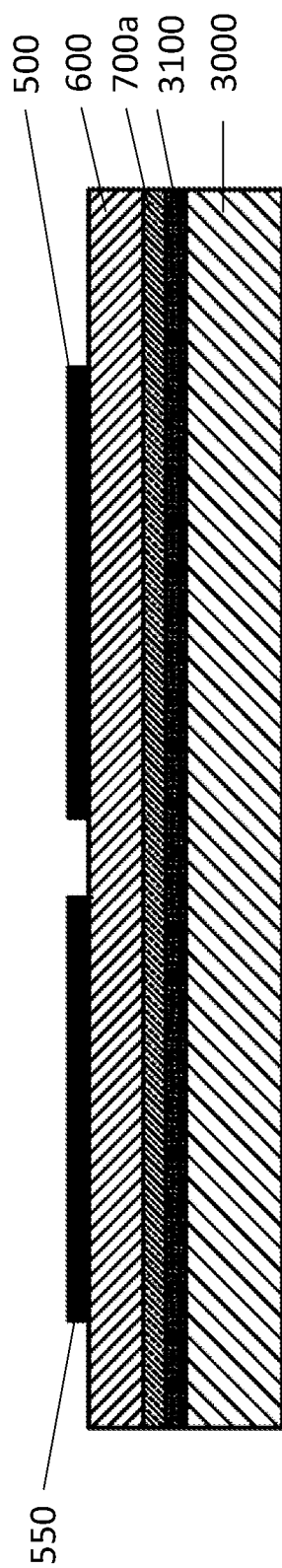

As illustrated in FIG. 9, bottom electrode layer 500a is patterned to form first bottom electrode 500 and second bottom electrode 550. The patterning may be achieved by etching, such as a plasma etching process, a wet chemical etching process, or a combination of the two. As a result of the patterning, an accurate pattern of first bottom electrode 500 and second bottom electrode 550 may be realized.

Figure 10:
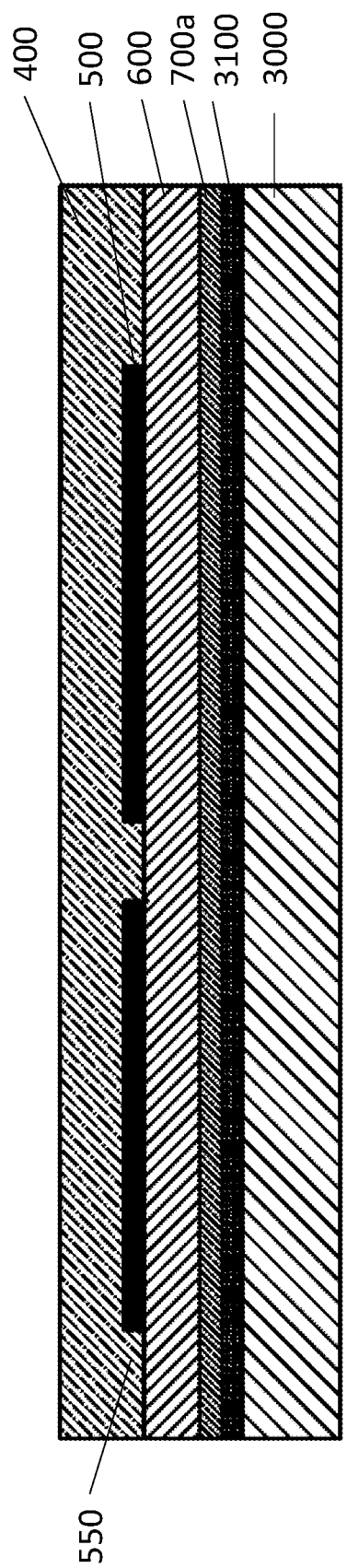

As illustrated in FIG. 10, a support layer 400 is deposited on the structure illustrated in FIG. 9. The material of support layer 400 may be silicon oxide. A part of support layer 400 will be removed during a subsequent release etching process, thereby forming first cavity 1000 and second cavity 2000.

Figure 11A:
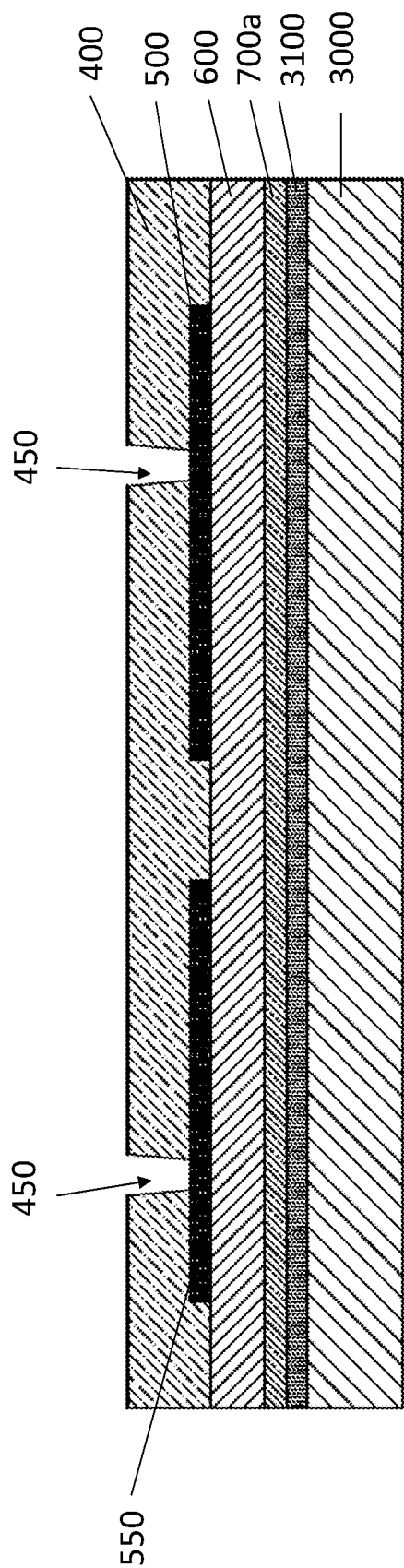
Figure 11B:
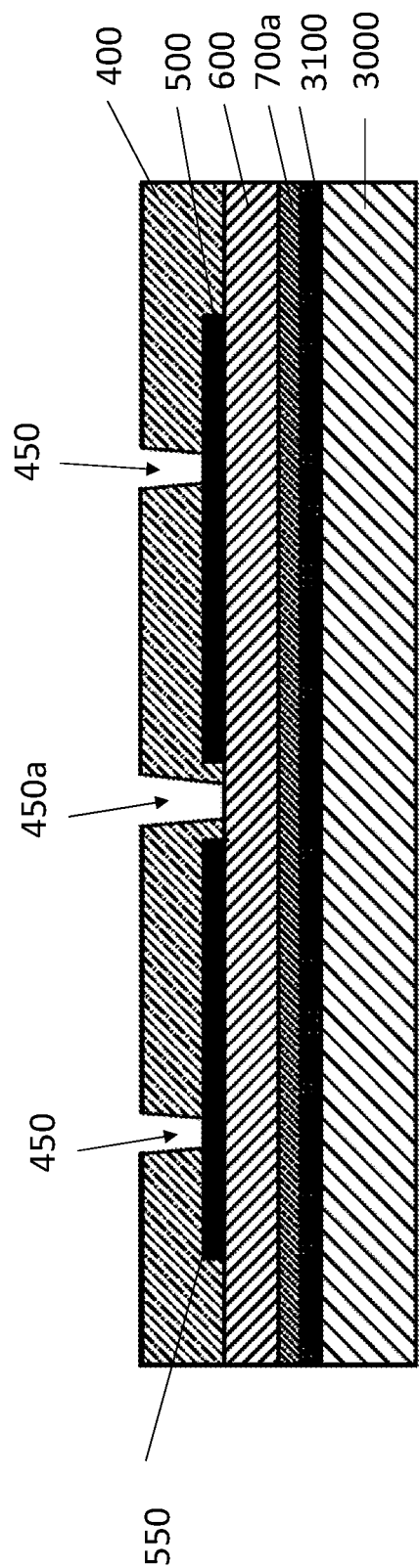

As illustrated in FIGS. 11A and 11B, support layer 400 is patterned by etching to form a trench 450 exposing either a portion of bottom electrode 500 or a portion of piezoelectric layer 600. Trench 450 has two ring shapes and is used to define the range of first cavity 1000 and second cavity 2000. As illustrated in FIG. 11B, a portion 450a of trench 450 exposes a portion of piezoelectric layer 600 between first bottom electrode 500 and second bottom electrode 550. Portion 450a is used to define a separation between first cavity 1000 and second cavity 2000.

Figure 12A:
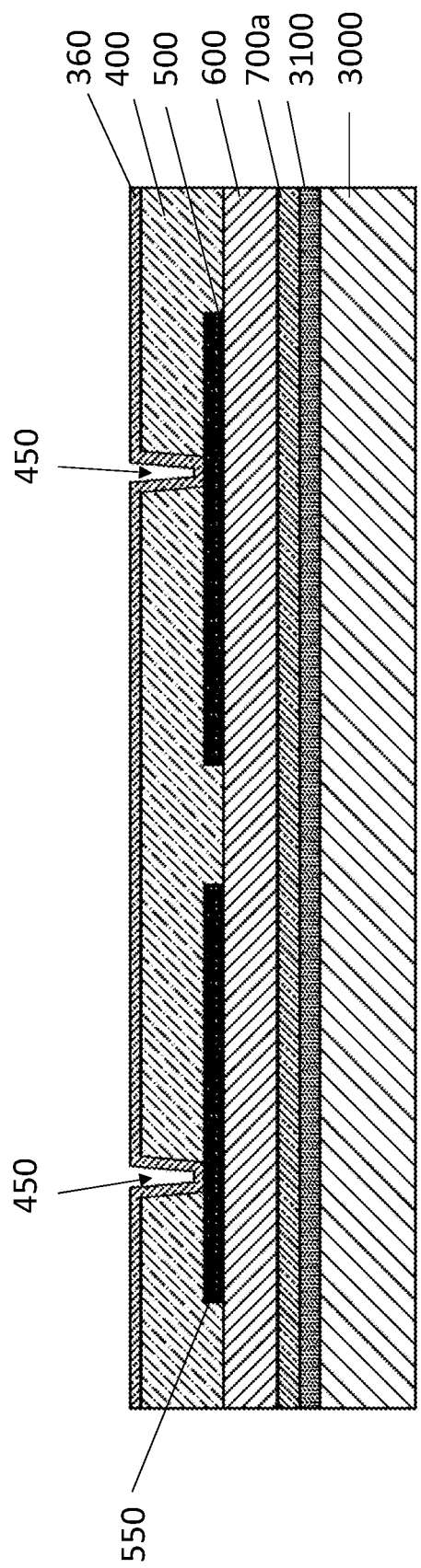
Figure 12B:
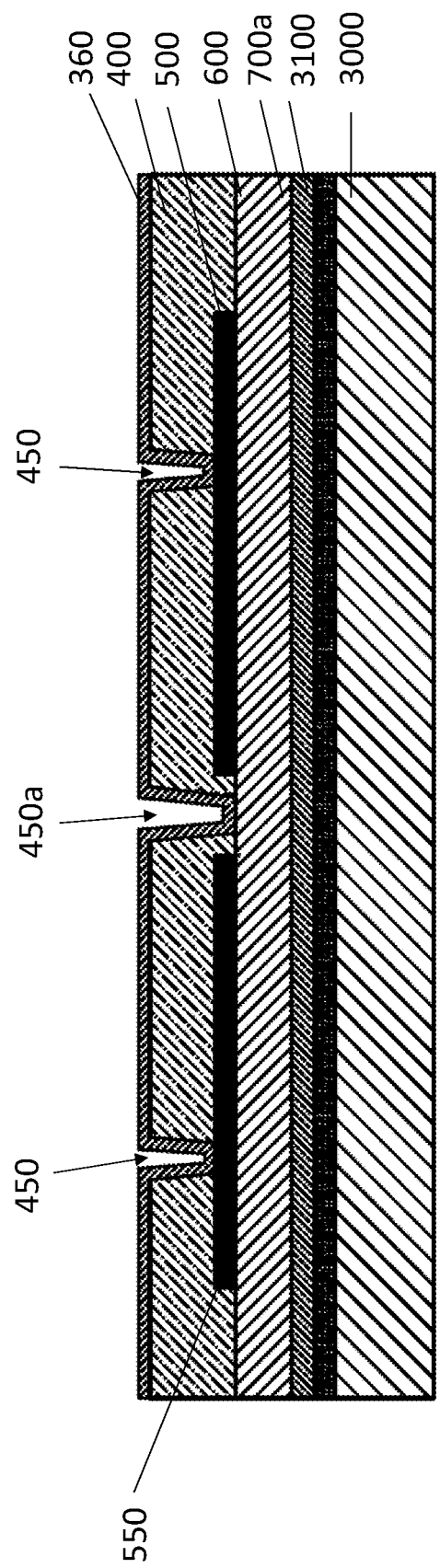

As illustrated in FIGS. 12A and 12B, boundary layer 360 is deposited on support layer 400, including sidewalls and bottom of trench 450. The material of boundary layer 360 may be silicon (Si), silicon nitride (SiN), aluminum nitride (AlN), or other non-conductive materials, or a stacked combination of two or more of these materials. Boundary layer 360 is deposited in trench 450, thereby defining a stop boundary during the subsequent release etching process of support layer 400 for defining first cavity 1000 and second cavity 2000. In the present embodiment, because the patterning of first bottom electrode 500 and second bottom electrode 550 is performed before first cavity 1000 and second cavity 2000 are defined, the patterning of first bottom electrode 500 and second bottom electrode 550 may be precisely controlled, thereby minimizing parasitic capacitance resulted from inaccurate patterning of first bottom electrode 500 and second bottom electrode 550.

Figure 13A:
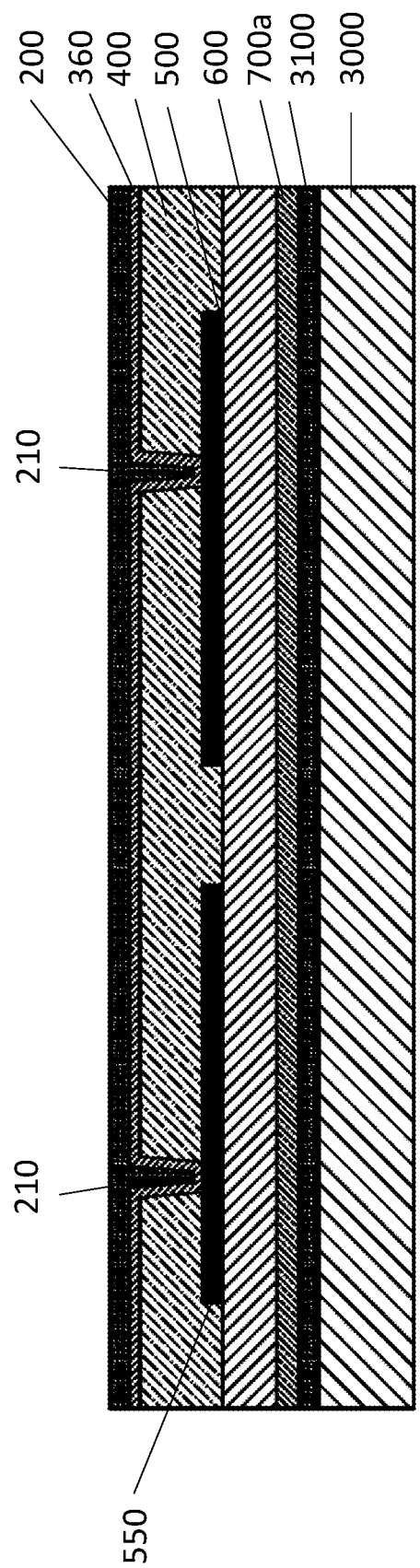
Figure 13B:
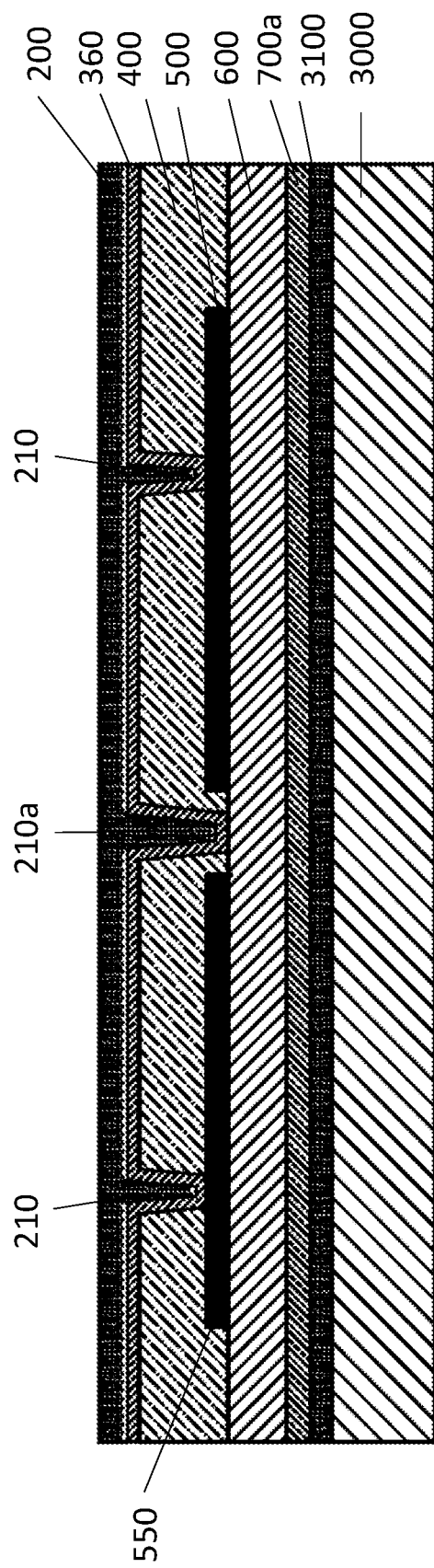

As illustrated in FIGS. 13A and 13B, bonding layer 200 is deposited on boundary layer 360, including the portion of boundary layer 360 deposited on the sidewalls and bottom of trench 450. Then, surface planarization and polishing are performed on bonding layer 200. The portion of the bonding layer 200 is deposited on trench 450 to form protruding structure 210, and thus trench 450 has the two ring shapes for defining the range of first cavity 1000 and second cavity 2000. As illustrated in FIG. 13B, protruding structure 210 includes a portion 210a to be extended between first cavity 1000 and second cavity 2000. Bonding layer 200 is used to bond substrate 100. The material of bottom bonding layer 200 may be silicon oxide, silicon nitride, or other materials, or a stacked combination of two or more of these materials. In the present embodiment, silicon oxide is used for bonding layer 200. The surface planarization and polishing may be performed by a chemical mechanical polishing (CMP) process.

Figure 14A:
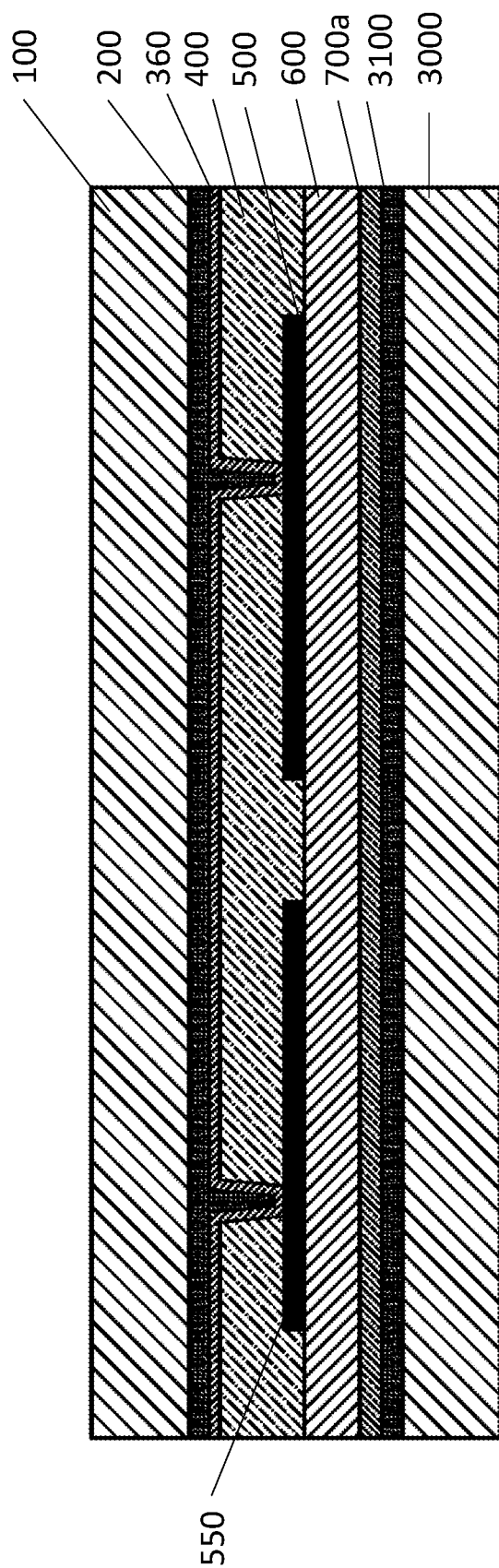
Figure 14B:
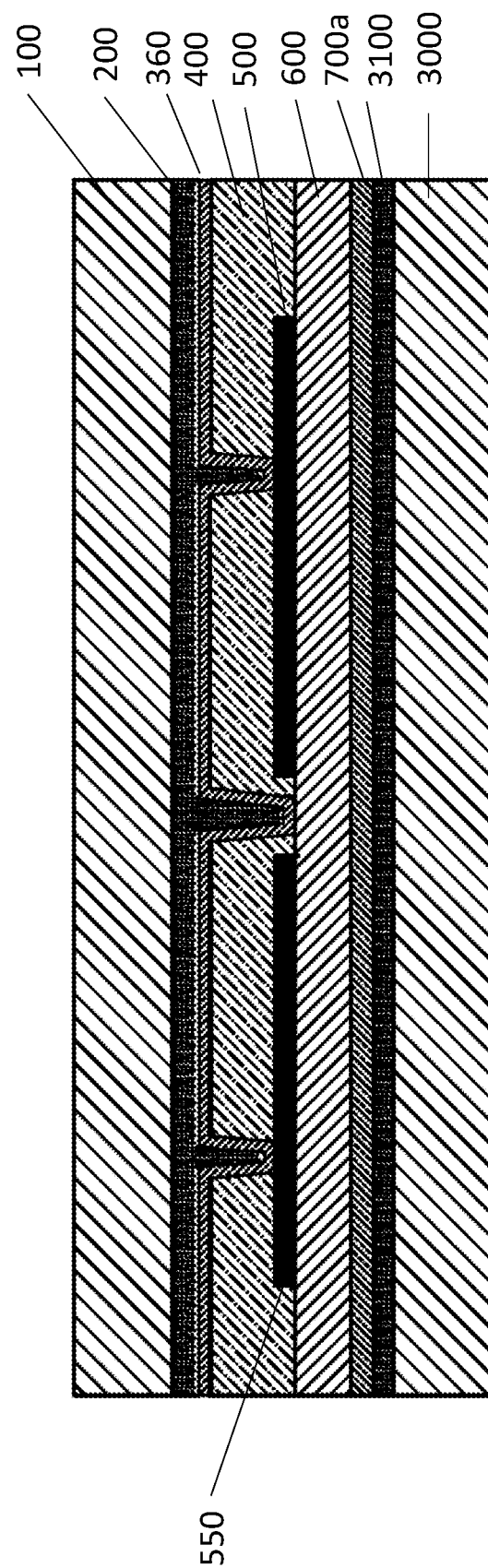

As illustrated in FIGS. 14A and 14B, substrate 100 is bonded to bonding layer 200. Substrate 100 may be a cap wafer that includes a material such as silicon (Si), carbon silicon (SiC), aluminum oxide, quartz, glass (SiO$_2$), or sapphire (Al$_2$O$_3$). In the present embodiment, substrate 100 includes silicon (Si).

Figure 15A:
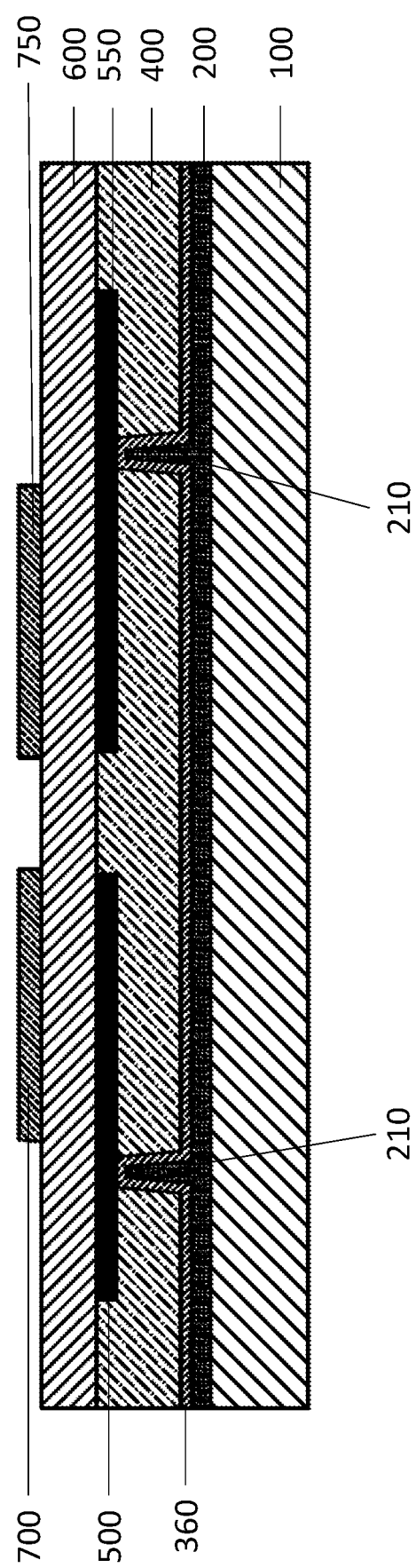
Figure 15B:
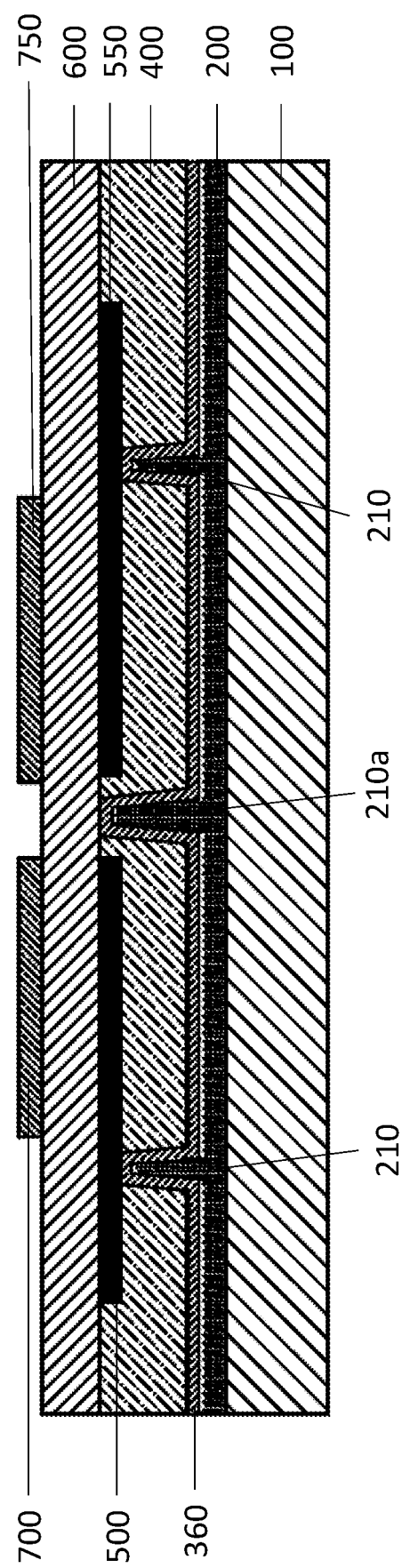

Then, the structure illustrated in FIGS. 14A and 14B is flipped over, and as illustrated in FIGS. 15A and 15B, temporary substrate 3000 and silicon oxide layer 3100 are removed. The removing of temporary substrate 3000 may be performed by a grinding process, a plasma dry etching process, a wet chemical etching process, or a combination thereof. In the present embodiment, temporary substrate 3000 is made of silicon material, and is removed by a combination of grinding and wet chemical etching, or a combination of grinding and plasma dry etching. Silicon oxide layer 3100 may be removed by plasma dry etching, wet chemical etching, or a combination of the two.

In addition, top electrode layer 700a is patterned by etching, to form first top electrode 700 and second top electrode 750. The etching process may be a plasma etching process, a wet chemical etching process, or a combination of the two. This step allows for precise patterning of first top electrode 700 and second top electrode 750. In combination of the precise patterning of first bottom electrode 500 and second bottom electrode 550, parasitic capacitance may be minimized.

Figure 16A:
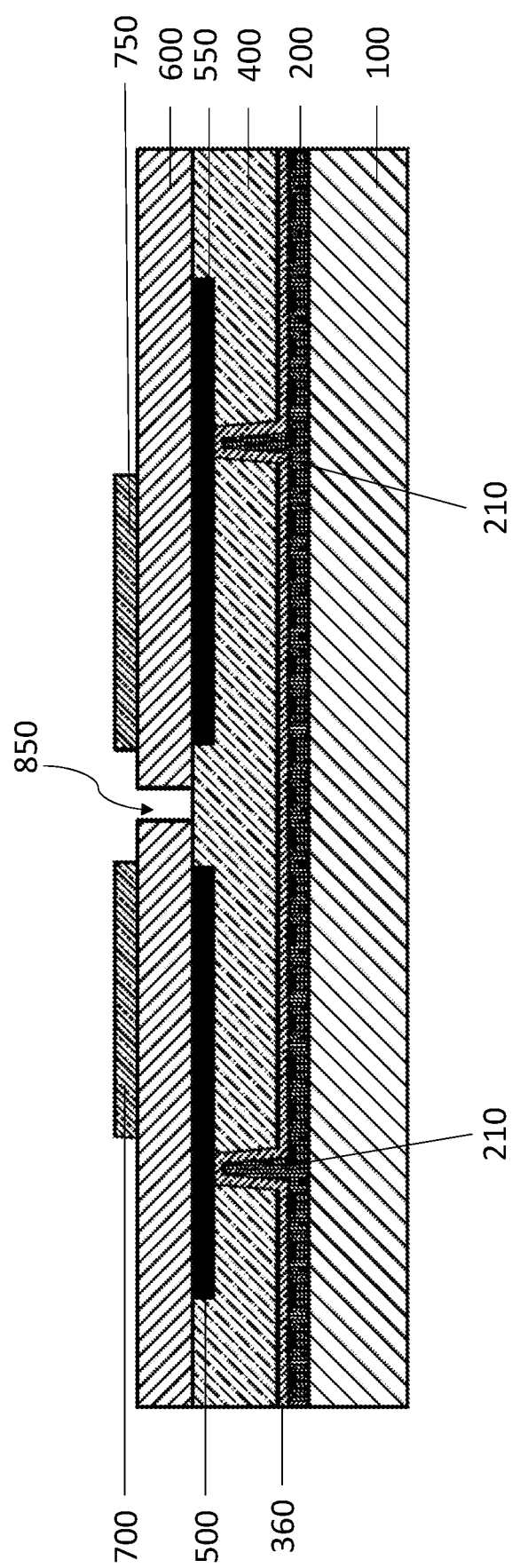
Figure 16B:
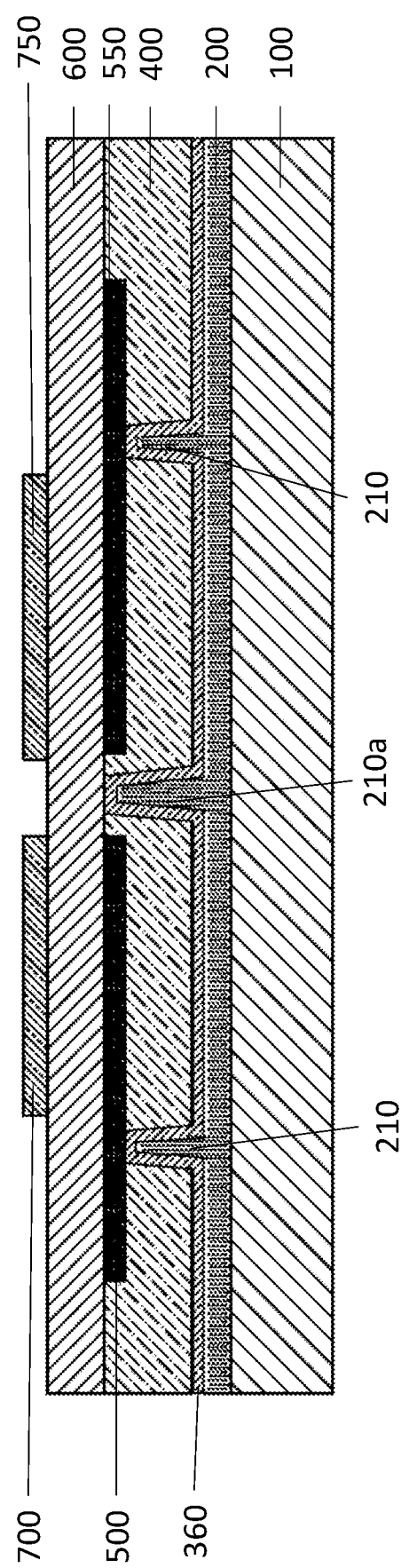

As illustrated in FIGS. 16A and 16B, a portion of piezoelectric layer 600 disposed above support layer 400 is etched to form release hole 850 for removing a portion of support layer 400 to form first cavity 1000 and second cavity 2000.

Figure 17A:
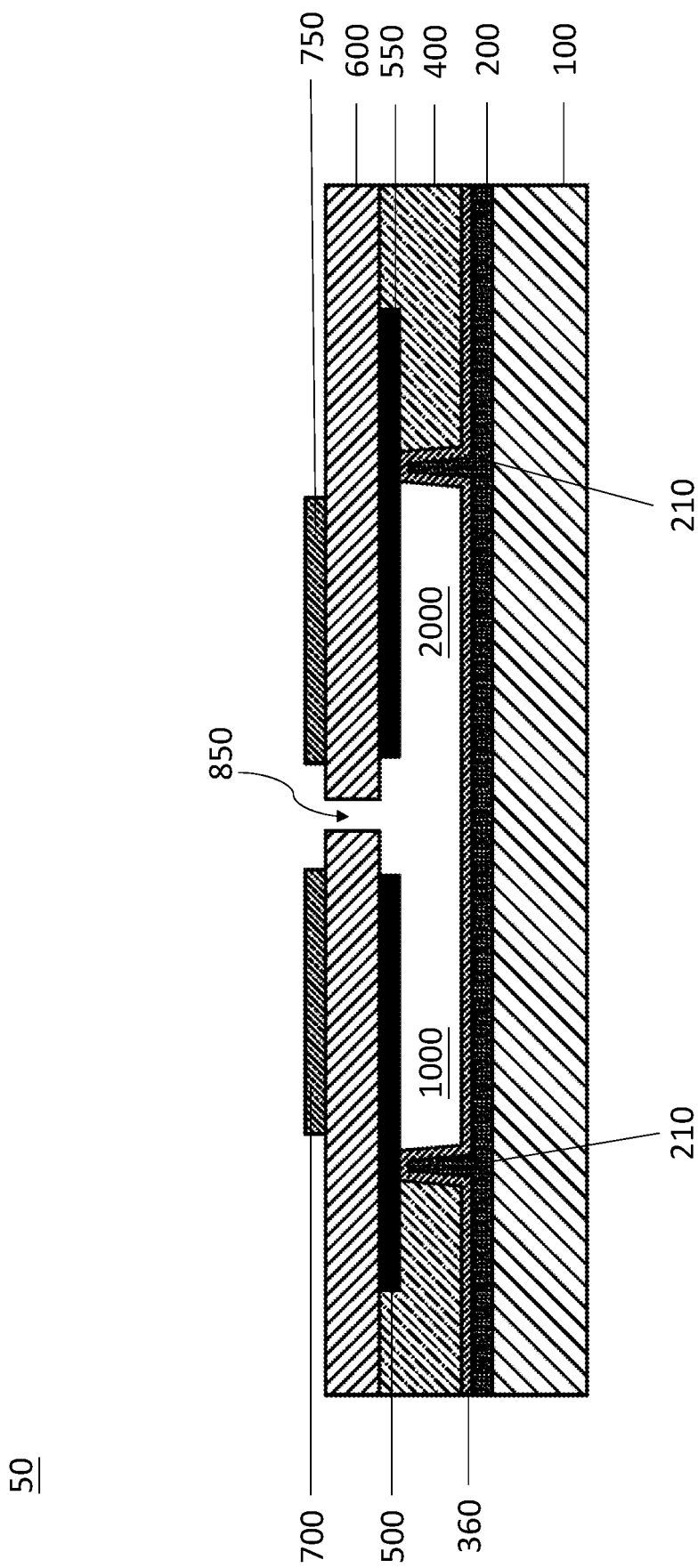
Figure 17B:
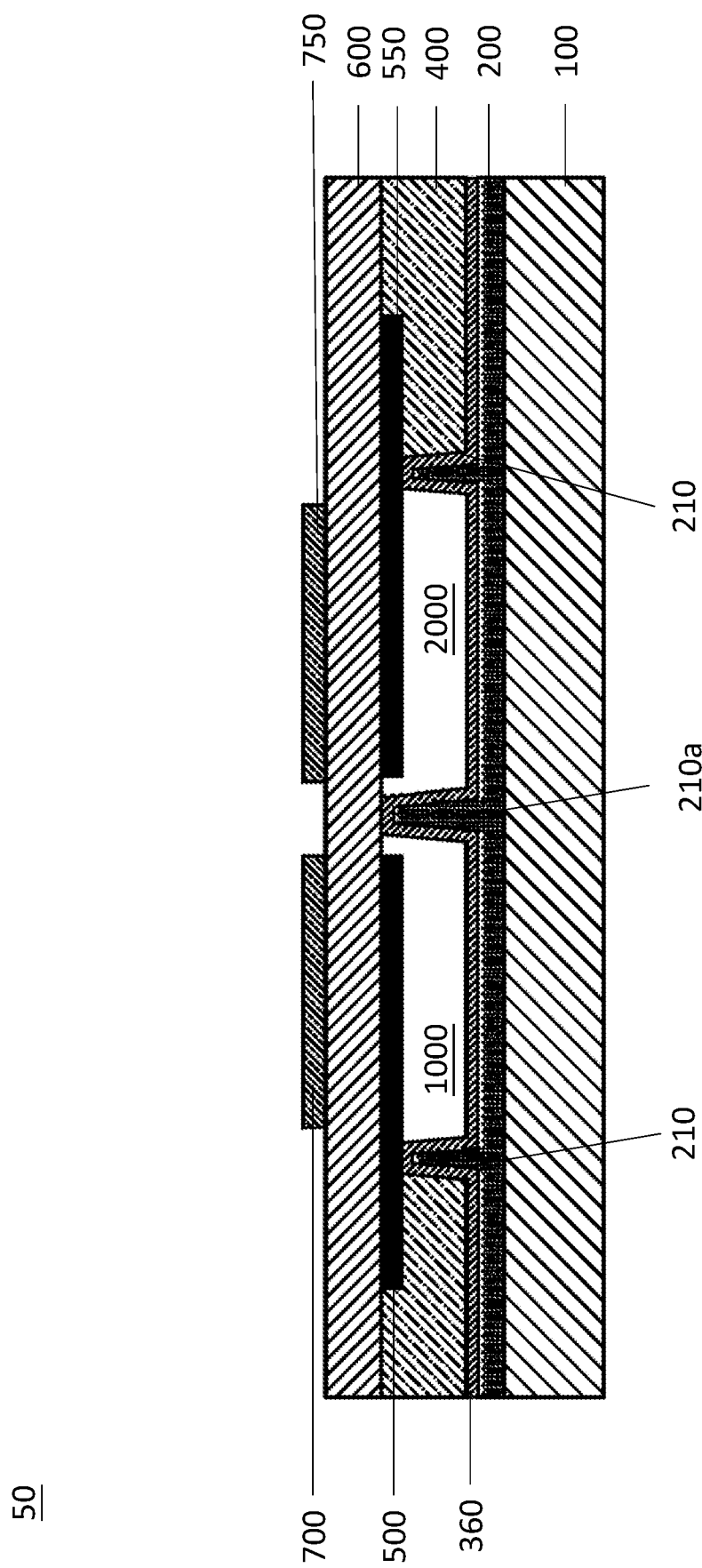

As illustrated in FIGS. 17A and 17B, support layer 400 is etched to form first cavity 1000 and second cavity 2000. In the present embodiment, support layer 400 is made from silicon oxide, and the etching and releasing process of support layer 400 may be performed by using hydrofluoric acid solution wet etching, buffered oxide etchant (BOE) solution wet etching, or hydrofluoric acid vapor corrosion, or a combination of these processes. The etching process stops at boundary layer 360. After forming first cavity 1000 and second cavity 2000, bulk acoustic wave filter 50 illustrated in FIG. 5 is fabricated.

Bulk acoustic wave filters 10 and 50 in the embodiments of the present disclosure provide the following advantages.

First, each one of first cavity 1000 and second cavity 2000 is enclosed by boundary structure 300. Boundary structure 300 has a double-wall structure with a certain thickness at the sides of first cavity 1000 and second cavity 2000, and is connected with piezoelectric layer 600, or bottom electrode 500 or 550. The bonding material (i.e., SiO$_2$) of bonding layer 200 is filled between the double walls of boundary structure 300.

Second, each one of bottom electrodes 500 and 550 is partially located in first cavity 1000 or second cavity 2000. Bottom electrode 500 or 550 does not completely cross first cavity 1000 or second cavity 2000. Nor does bottom electrode 500 or 550 completely extend out of first cavity 1000 or second cavity 2000. Therefore, parasitic capacitance of the resonator formed by overlapping portions of bottom electrode 500 or 550, top electrode 700 or 750, and piezoelectric layer 600 outside of cavity 1000 or 2000 may be avoided, thereby improving the performance of the resonator and the filter including the same.

Third, the sides of first bulk acoustic wave resonator 20 and second bulk acoustic wave resonator 30 that are adjacent to each other share the same boundary structure 300. Therefore, there is no need for forming a completely independent boundary structure for each one of first cavity 1000 and second cavity 2000, thereby saving the resonator spacing and reducing the chip size.

Fourth, the release holes of first bulk acoustic wave resonator 20 and second bulk acoustic wave resonator 30 can be arranged at various positions (e.g., positions of release holes 810 through 850). At least one of the positions can be selected according to actual design requirements, so as to minimize the distance between the resonators, thereby minimizing the chip size.

Fifth, at the angle between the adjacent sides of the two adjacent resonators 20 and 30, boundary structure 300 includes protrusion 350 that protrudes away from first and second bottom electrodes 500 and 550. A release conduction channel exists between protrusion 350 and boundary portion 300a that extends between first cavity 1000 and second cavity 2000. Release hole 850 is in the release conduction channel. That is, the two adjacent resonators 20 and 30 share a release hole, so that the resonator spacing is minimized.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A bulk acoustic wave resonator, comprising:
   a substrate;
   a support layer disposed on the substrate, the support layer including a cavity having a polygon shape with more than three sides in a plane crossing a first direction from the substrate to the support layer;
   a piezoelectric layer disposed on the support layer;
   a bottom electrode disposed below the piezoelectric layer, partially overlapping the cavity, and extending across a first side of the cavity;
   a top electrode disposed above the piezoelectric layer, partially overlapping the cavity, and extending across a second side of the cavity;
   at least one release hole formed in the piezoelectric layer and overlapping a portion of the cavity, the at least one release hole including at least one of:
      a first release hole located adjacent to a side of the cavity that is different from the first side and the second side;
      a second release hole located adjacent to the first side of the cavity, and overlapping the bottom electrode; or
      a third release hole located adjacent to the second side of the cavity, and overlapping the top electrode;
   a bonding layer disposed between the substrate and the support layer and including a protruding structure; and
   a boundary layer overlying the bonding layer,
   wherein at least a portion of the boundary layer is formed between the protruding structure and the bottom electrode.

2. The bulk acoustic wave resonator of claim 1,
   wherein the boundary layer and the protruding structure of the bonding layer constitute a double-wall boundary structure surrounding the cavity.

3. The bulk acoustic wave resonator of claim 2, wherein portions of the bottom electrode, the piezoelectric layer, and the top electrode that overlap with each other constitute an active area,
   the double-wall boundary structure includes at least one protrusion protruding away from the active area, and
   the at least one release hole is located next to the at least one protrusion.

4. The bulk acoustic wave resonator of claim 2, wherein the bonding layer is formed of SiO$_2$ for bonding the substrate and the boundary layer.

5. The bulk acoustic wave resonator of claim 2, wherein the boundary layer is formed of SiN, AlN, polysilicon, amorphous silicon or a stacked combination of two or more of those materials.

6. The bulk acoustic wave resonator of claim 2, wherein the double-wall boundary structure connects to the piezoelectric layer or the bottom electrode.

7. The bulk acoustic wave resonator of claim 1, wherein the bulk acoustic wave resonator comprises the second release hole, and the bottom electrode comprises an opening overlapping the second release hole, a diameter of the opening being greater than a diameter of the second release hole.

8. The bulk acoustic wave resonator of claim 1, wherein the bulk acoustic wave resonator comprises the third release hole, and the top electrode includes an opening overlapping the third release hole, a diameter of the opening being greater than a diameter of the third release hole.

9. The bulk acoustic wave resonator of claim 1, wherein the support layer is formed of $SiO_2$.

10. The bulk acoustic wave resonator of claim 1, wherein the substrate is formed of Si, glass, SiC, sapphire ($Al_2O_3$), or GaN.

11. A bulk acoustic wave filter, comprising:
a first bulk acoustic wave resonator and a second bulk acoustic wave resonator located next to each other,
wherein the first bulk acoustic wave resonator includes:
a substrate;
a support layer disposed on the substrate, the support layer including a cavity having a polygon shape with more than three sides, one side of the cavity being shared with a cavity of the second bulk acoustic wave resonator;
a piezoelectric layer disposed on the support layer;
a bottom electrode disposed below the piezoelectric layer, partially overlapping the cavity, and extending across a first side of the cavity;
a top electrode disposed above the piezoelectric layer, partially overlapping the cavity, and extending across a second side of the cavity;
at least one release hole formed in the piezoelectric layer and overlapping a portion of the cavity, the at least one release hole including at least one of:
a first release hole located adjacent to a side of the cavity that is different from the first side and the second side;
a second release hole located adjacent to the first side of the cavity, and overlapping with the bottom electrode;
a third release hole located adjacent to the second side of the cavity, and overlapping with the top electrode; or
a fourth release hole located adjacent to an end of the side of the cavity that is shared with the cavity of the second bulk acoustic wave resonator;
a bonding layer disposed between the substrate and the support layer and including a protruding structure; and
a boundary layer overlying the bonding layer,
wherein at least a portion of the boundary layer is formed between the protruding structure and the bottom electrode.

12. The bulk acoustic wave filter of claim 11, wherein the boundary layer and the protruding structure of the bonding layer constitute a double-wall boundary structure surrounding the cavity.

13. The bulk acoustic wave filter of claim 12, wherein the double-wall boundary structure includes at least one protrusion protruding away from the bottom electrode and the top electrode, and
the at least one release hole is located next to the at least one protrusion.

14. The bulk acoustic wave filter of claim 12, wherein the bonding layer is formed of $SiO_2$ for bonding the substrate and the boundary layer.

15. The bulk acoustic wave filter of claim 12, wherein the boundary layer is formed of SiN, AlN, polysilicon, amorphous silicon or a stacked combination of two or more of those materials.

16. The bulk acoustic wave filter of claim 12, wherein the double-wall boundary structure connects to the piezoelectric layer or the bottom electrode.

17. The bulk acoustic wave filter of claim 11, wherein the first bulk acoustic wave resonator includes the second release hole, and the bottom electrode includes an opening overlapping the second release hole, a diameter of the opening being greater than a diameter of the second release hole.

18. The bulk acoustic wave filter of claim 11, wherein the first bulk acoustic wave resonator includes the third release hole, and the top electrode includes an opening overlapping the third release hole, a diameter of the opening being greater than a diameter of the third release hole.

19. The bulk acoustic wave filter of claim 11, wherein the support layer is formed of $SiO_2$.

20. The bulk acoustic wave filter of claim 11, wherein the substrate is formed of Si, glass, SiC, sapphire ($Al_2O_3$), or GaN.

* * * * *